( 12 ) United States Patent
Cha et al.

(10) Patent No.: US 10,553,752 B2
(45) Date of Patent: Feb. 4, 2020

(54) LIGHT-EMITTING DEVICE AND DISPLAY DEVICE INCLUDING THE SAME

(71) Applicant: Samsung Electronics Co., Ltd., Suwon-si, Gyeonggi-do (KR)

(72) Inventors: Nam-goo Cha, Hwaseong-si (KR); Young-soo Park, Yongin-si (KR); Dong-hyun Cho, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/270,156

(22) Filed: Sep. 20, 2016

(65) Prior Publication Data

US 2017/0162746 A1 Jun. 8, 2017

(30) Foreign Application Priority Data

Dec. 2, 2015 (KR) .......................... 10-2015-0170657

(51) Int. Cl.
*H01L 33/10* (2010.01)
*H01L 33/60* (2010.01)
(Continued)

(52) U.S. Cl.
CPC ............ *H01L 33/10* (2013.01); *H01L 27/153* (2013.01); *H01L 33/06* (2013.01); *H01L 33/385* (2013.01); *H01L 33/504* (2013.01); *H01L 33/60* (2013.01)

(58) Field of Classification Search
CPC ....... H01L 33/10; H01L 27/153; H01L 33/06; H01L 33/504; H01L 33/385; H01L 33/60; H01L 25/0753; H01L 33/46
See application file for complete search history.

(56) References Cited

U.S. PATENT DOCUMENTS 6,297,076 B1 10/2001 Amagai et al.
6,372,608 B1 4/2002 Shimoda et al.
(Continued)

FOREIGN PATENT DOCUMENTS

CN 1434984 A 8/2003
CN 1445869 A 10/2003
(Continued)

OTHER PUBLICATIONS

L. Zhu et al., "Vertically Mounted InGaN-on-Sapphire Light-Emitting Diodes", The HKU Scholars Hub, The University of Hong Kong, IEEE Transactions on Electron Devices, vol. 58, No. 2, Feb. 2011, pp. 490-494.
(Continued)

*Primary Examiner* — Hoang-Quan T Ho
(74) *Attorney, Agent, or Firm* — Lee & Morse, P.C.

(57) ABSTRACT

A light-emitting device includes a substrate including a top surface and a first side surface, wherein an area of the top surface is larger than an area of the first side surface, and a light-emitting structure on the first side surface of the substrate, the light-emitting structure having a first-conductivity-type semiconductor layer, a second-conductivity-type semiconductor layer, and an active layer between the first-conductivity-type semiconductor layer and the second-conductivity-type semiconductor layer, wherein the light-emitting structure emits a first light having a first peak wavelength, and wherein an emission area of a first light emitted through the top surface of the substrate is larger than an emission area of a first light emitted through the first side surface of the substrate.

9 Claims, 26 Drawing Sheets

(51) Int. Cl.
*H01L 33/50* (2010.01)
*H01L 33/38* (2010.01)
*H01L 33/06* (2010.01)
*H01L 27/15* (2006.01)

(56) References Cited

U.S. PATENT DOCUMENTS

| | | | |
|---|---|---|---|
| 6,645,830 B2 | 11/2003 | Shimoda et al. |
| RE38,466 E | 3/2004 | Inoue et al. |
| 6,730,939 B2 | 5/2004 | Eisert et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,038,245 B2 | 5/2006 | Nitta et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,195,942 B2 | 3/2007 | Eisert et al. |
| 7,208,725 B2 | 4/2007 | Sherrer et al. |
| 7,221,416 B2 | 5/2007 | Hahm et al. |
| 7,265,341 B2 | 9/2007 | Mizutani |
| 7,288,758 B2 | 10/2007 | Sherrer et al. |
| 7,319,044 B2 | 1/2008 | Han et al. |
| 7,501,656 B2 | 3/2009 | Han et al. |
| 7,517,127 B2 | 4/2009 | Takada |
| 7,569,427 B2 | 8/2009 | Theuss |
| 7,575,358 B2 | 8/2009 | Suzuki et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,915,619 B2 | 3/2011 | Nabekura et al. |
| 7,940,350 B2 | 5/2011 | Jeong |
| 7,959,312 B2 | 6/2011 | Yoo et al. |
| 7,964,881 B2 | 6/2011 | Choi et al. |
| 7,982,228 B2 | 7/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,022,427 B2 | 9/2011 | Miyake et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,479 B2 | 9/2012 | Fukuyo et al. |
| 8,263,987 B2 | 9/2012 | Choi et al. |
| 8,324,646 B2 | 12/2012 | Lee et al. |
| 8,349,116 B1 | 1/2013 | Bibl et al. |
| 8,399,944 B2 | 3/2013 | Kwak et al. |
| 8,409,968 B2 | 4/2013 | Fukuyo et al. |
| 8,426,227 B1 | 4/2013 | Bibl et al. |
| 8,432,511 B2 | 4/2013 | Jeong |
| 8,450,187 B2 | 5/2013 | Fukuyo et al. |
| 8,459,832 B2 | 6/2013 | Kim |
| 8,502,242 B2 | 8/2013 | Kim |
| 8,517,564 B2 | 8/2013 | Kim et al. |
| 8,536,604 B2 | 9/2013 | Kwak et al. |
| 8,552,436 B2 | 10/2013 | Bibl et al. |
| 8,558,243 B2 | 10/2013 | Bibl et al. |
| 8,573,469 B2 | 11/2013 | Hu et al. |
| 8,735,931 B2 | 5/2014 | Han et al. |
| 8,766,295 B2 | 7/2014 | Kim |
| 8,791,474 B1 | 7/2014 | Bibl et al. |
| 8,794,501 B2 | 8/2014 | Bibl et al. |
| 8,809,875 B2 | 8/2014 | Bibl et al. |
| 8,835,940 B2 | 9/2014 | Hu et al. |
| 8,865,566 B2 | 10/2014 | Fukuyo et al. |
| 8,889,439 B2 | 11/2014 | Tseng et al. |
| 8,928,021 B1 | 1/2015 | Bibl et al. |
| 8,933,433 B2 | 1/2015 | Higginson et al. |
| 8,987,765 B2 | 3/2015 | Bibl et al. |
| 9,029,880 B2 | 5/2015 | Sakariya et al. |
| 9,035,279 B2 | 5/2015 | Hu et al. |
| 9,087,764 B2 | 7/2015 | Chan et al. |
| 9,105,714 B2 | 8/2015 | Hu et al. |
| 9,111,464 B2 | 8/2015 | Bibl et al. |
| 9,178,115 B2 | 11/2015 | Suzuki et al. |
| 9,184,338 B2 | 11/2015 | Cho et al. |
| 2002/0125485 A1* | 9/2002 | Steigerwald ............ H01L 33/02 257/79 |
| 2010/0302218 A1 | 12/2010 | Bita et al. |
| 2012/0077314 A1 | 3/2012 | Park et al. |
| 2012/0145994 A1* | 6/2012 | Adivarahan ........ H01L 21/0237 257/13 |
| 2014/0103372 A1 | 4/2014 | Tseng et al. |
| 2014/0312368 A1 | 10/2014 | Lee et al. |
| 2014/0339581 A1* | 11/2014 | Kwon ................ H01L 33/0079 257/94 |
| 2016/0087165 A1 | 3/2016 | Lee et al. |
| 2016/0351457 A1 | 12/2016 | Chen et al. |

FOREIGN PATENT DOCUMENTS

| | | |
|---|---|---|
| CN | 101379623 A | 3/2009 |
| CN | 101567417 A | 10/2009 |
| CN | 101866588 A | 10/2010 |
| CN | 201689620 U | 12/2010 |
| CN | 102454905 A | 5/2012 |
| CN | 103258947 A | 8/2013 |
| CN | 103890914 A | 6/2014 |
| CN | 106206651 A | 12/2016 |
| JP | 2000-315816 A | 11/2000 |
| JP | 2001-308234 A | 11/2001 |
| JP | 2012-227470 A | 11/2012 |
| JP | 2013-251400 A | 12/2013 |
| JP | 2014-212320 A | 11/2014 |
| KR | 20-2004-0010141 A | 4/2004 |
| KR | 10-2005-0084878 A | 8/2005 |
| KR | 10-2007-0008071 A | 1/2007 |
| KR | 10-2007-0011419 A | 1/2007 |
| KR | 10-2011-0082162 A | 7/2011 |
| KR | 10-2011-0132754 A | 12/2011 |
| KR | 10-2012-0032254 A | 4/2012 |
| KR | 10-2014-0026276 A | 3/2014 |
| KR | 10-2014-0136616 A | 12/2014 |

OTHER PUBLICATIONS

Chinese Office action dated Jan. 24, 2019 for corresponding CN 201611090753.1, Cha, et al.

* cited by examiner

FIG. 6
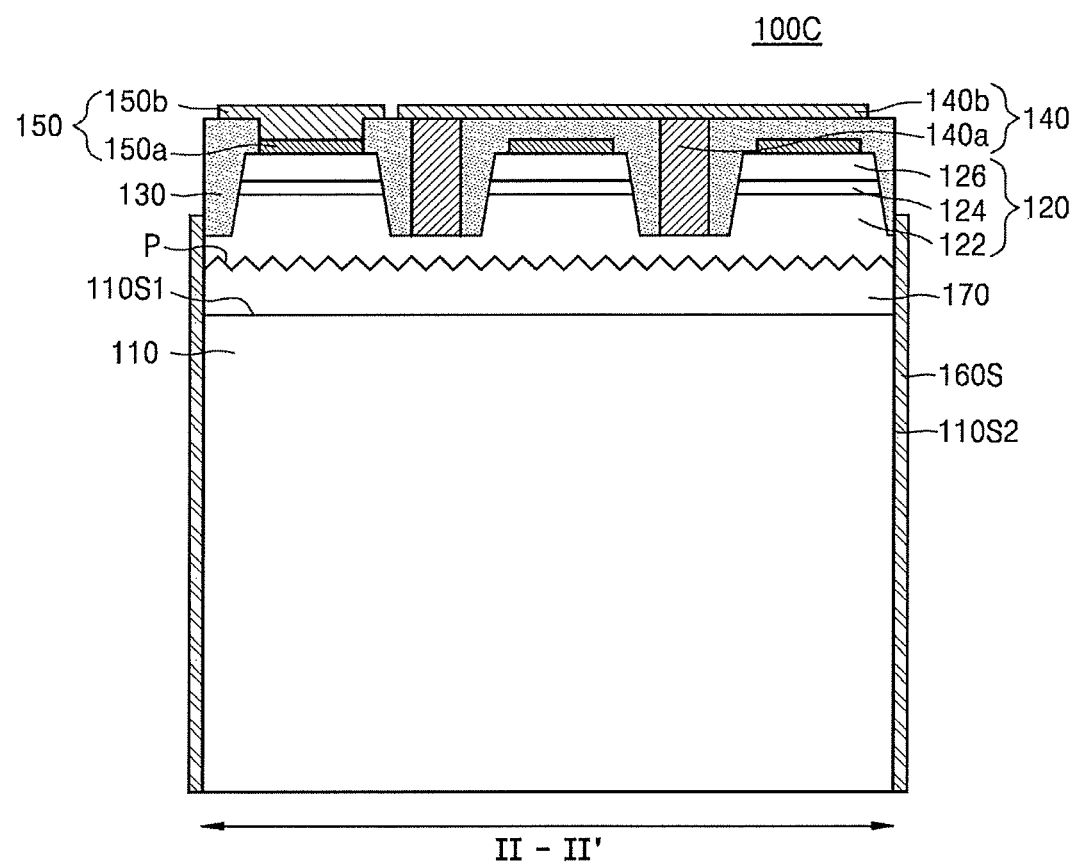
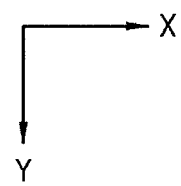

LIGHT-EMITTING DEVICE AND DISPLAY DEVICE INCLUDING THE SAME

CROSS-REFERENCE TO RELATED APPLICATION

Korean Patent Application No. 10-2015-0170657, filed on Dec. 2, 2015, in the Korean Intellectual Property Office, and entitled: "Light-Emitting Device and Display Device Including the Same," is incorporated by reference herein in its entirety.

BACKGROUND

1. Field

Embodiments relate to a light-emitting device and a display device including the same, and more particularly, to a light-emitting device using side illumination and a display device including the light-emitting device in at least one pixel.

2. Description of the Related Art

A light-emitting diode (LED) has been employed for various products, e.g., a lighting apparatus and a backlight of a display device, because the LED has a longer lifespan and lower power consumption than other light sources. In general, a LED used as a backlight of a display device may be arranged in an edge portion or a lower portion of the display device and project light to a pixel of the display device. However, non-uniformity of luminance may occur or optical efficiency may be degraded according to a distance between the LED and each pixel.

SUMMARY

Embodiments provide a light-emitting device capable of emitting uniform light in a large emission area. Also, embodiments provide a display device capable of displaying a uniform image with high luminance.

According to an aspect of embodiments, there is provided a light-emitting device including a substrate including a top surface and a first side surface, wherein an area of the top surface is larger than an area of the first side surface, and a light-emitting structure disposed on the first side surface of the substrate. The light-emitting structure includes a first-conductivity-type semiconductor layer, a second-conductivity-type semiconductor layer, and an active layer interposed between the first-conductivity-type semiconductor layer and the second-conductivity-type semiconductor layer. The light-emitting structure emits first light having a first peak wavelength. An emission area of first light emitted through the top surface of the substrate is larger than an emission area of first light emitted through the first side surface of the substrate.

According to another aspect of embodiments, there is provided a display device including a plurality of pixels. Each of the plurality of pixels includes a first light-emitting device and a second light-emitting device. The first light-emitting device and the second light-emitting device are disposed on a lower substrate and emit first light having a first peak wavelength and second light having a second peak wavelength, respectively. At least one of the first light-emitting device and the second light-emitting device includes a substrate and a light-emitting structure disposed on a first side surface of the substrate. The substrate has a first height in a first direction perpendicular to a top surface of the lower substrate and a first width in a second direction parallel to the top surface of the lower substrate, and the first width is larger than the first height.

According to yet another aspect of embodiments, there is provided a display device including a plurality of pixels. Each of the plurality of pixels includes a first light-emitting device and a second light-emitting device. The first light-emitting device and the second light-emitting device are disposed on a lower substrate and emit first light having a first peak wavelength and second light having a second peak wavelength, respectively. At least one of the first light-emitting device and the second light-emitting device includes a substrate having a top surface and a first side surface and a light-emitting structure disposed on the first side surface of the substrate. A ratio of an area of the top surface of the substrate to an area of the light-emitting structure ranges from about 2:1 to about 100:1.

According to still another aspect of embodiments, there is provided a display device including a lower substrate, and a plurality of pixels on the lower substrate, each pixel of the plurality of pixels including at least a first light-emitting device and a second light-emitting device, wherein each of the first and second light-emitting devices includes a device substrate having a top surface and a first side surface, the first side surface being perpendicular to the top surface, and a ratio area of the top surface to the first side surface being about 2:1 to about 100:1, and a light-emitting structure on the first side surface of the device substrate to emit light into the device substrate through the first side surface.

BRIEF DESCRIPTION OF THE DRAWINGS

Features will become apparent to those of ordinary skill in the art by describing in detail exemplary embodiments with reference to the attached drawings, in which:

FIG. 6 illustrates a cross-sectional view of a light-emitting device according to an embodiment;

DETAILED DESCRIPTION

A light-emitting device and a display device, which will be described below, may have various configurations. Here, examples of only required elements of the light-emitting device and the display device will be presented, and embodiments are not limited thereto.

Figure 1:
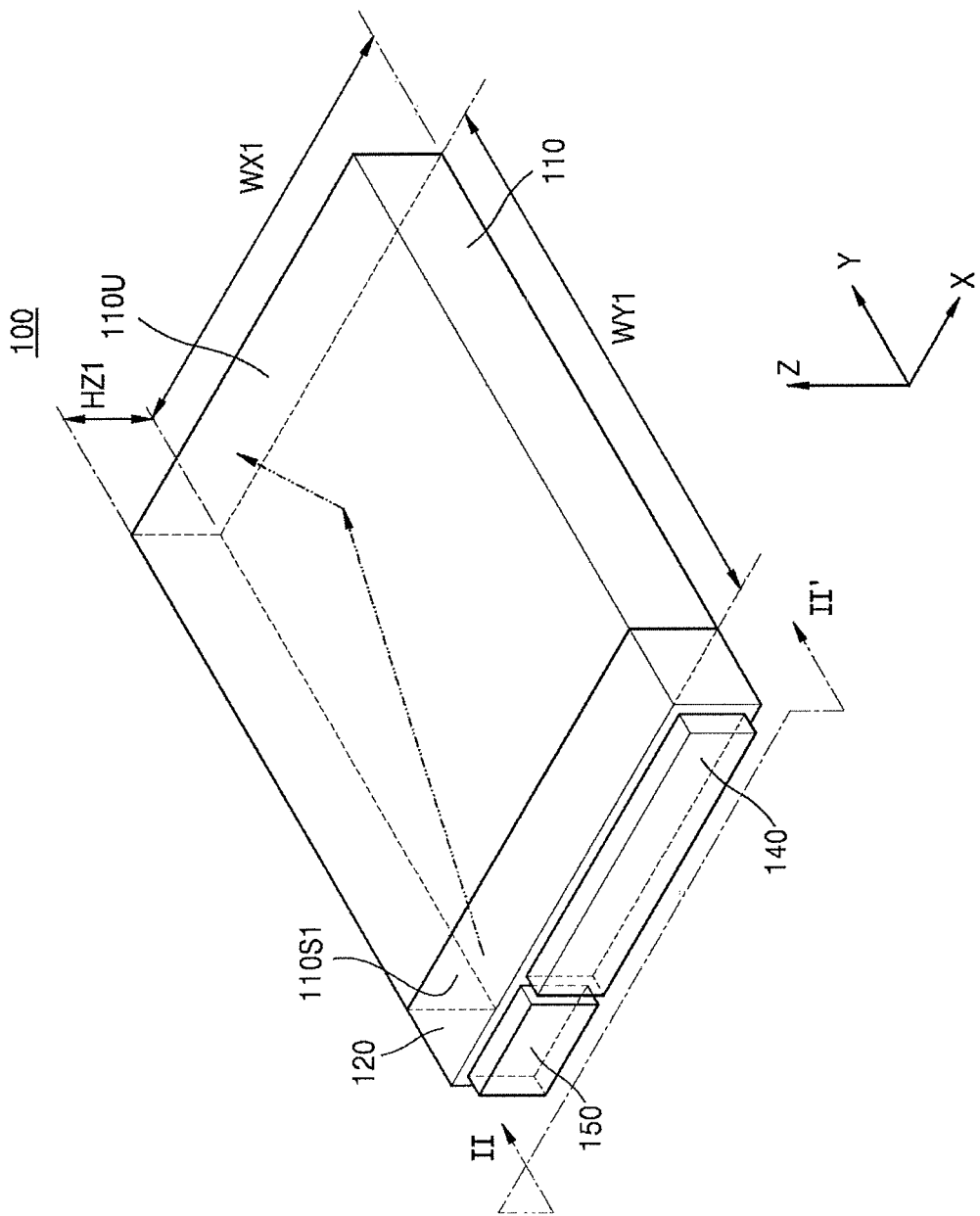
FIG. 1 illustrates a perspective view of a light-emitting device according to an embodiment.
Figure 2:
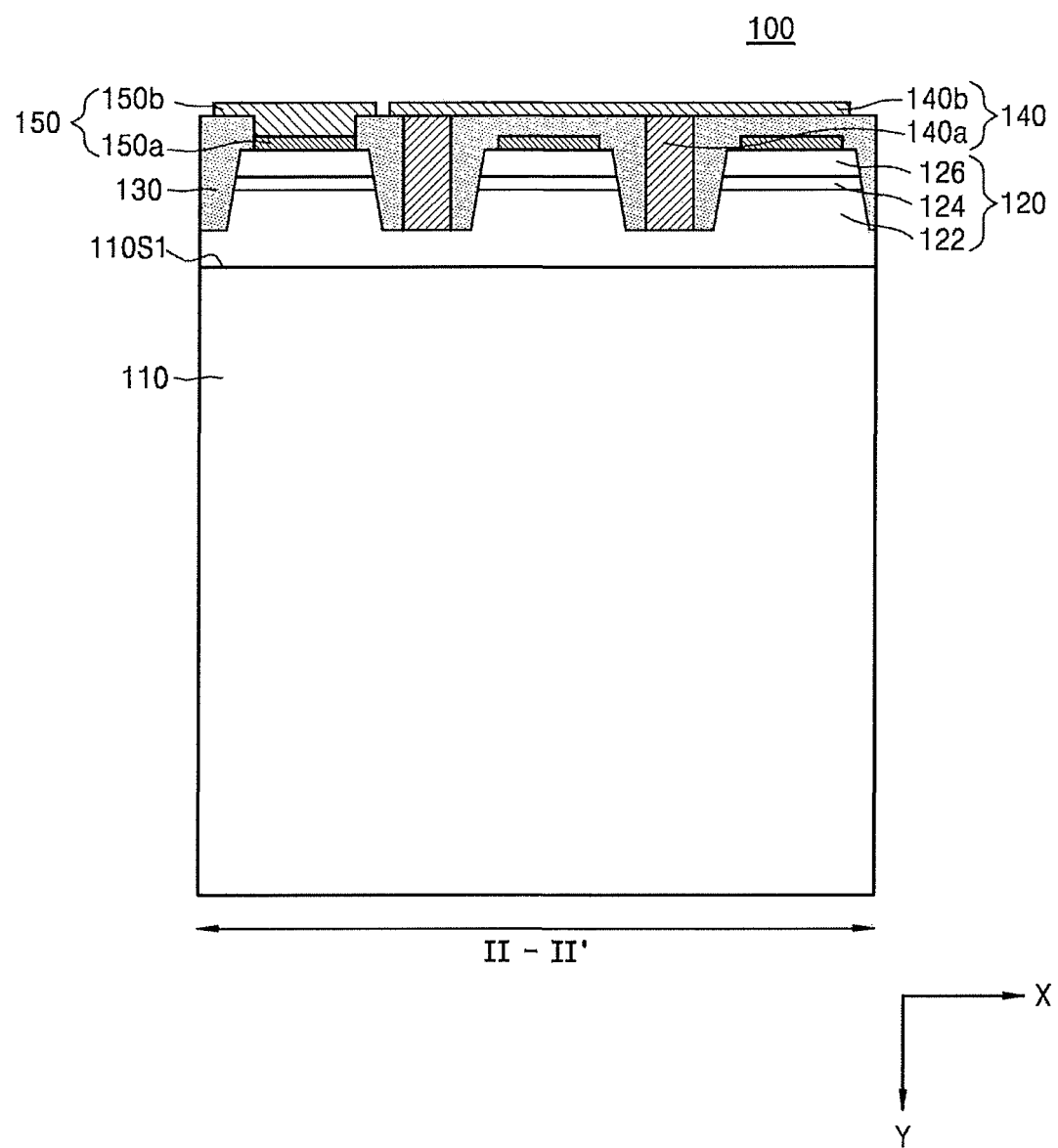
FIG. 2 illustrates a cross-sectional taken along line II-II' of FIG. 1.

FIG. 1 is a perspective view of a light-emitting device 100 according to an embodiment. FIG. 2 is a cross-sectional view taken along line II-II' of FIG. 1, which is parallel to an X-Y plane.

Referring to FIGS. 1 and 2, the light-emitting device 100 may include a substrate 110 and a light-emitting structure 120 disposed on a first side surface 110S1 of the substrate 110.

The substrate 110 may be a crystal growth substrate of the light-emitting structure 120. The substrate 110 may be an insulating and/or transmissive substrate, e.g., sapphire. However, a kind of the substrate 110 is not limited thereto. The substrate 110 may be a conductive substrate or a semiconductor substrate in addition to an insulating substrate. For example, in addition to sapphire, the substrate 110 may include SiC, Si, $MgAl_2O_4$, MgO, $LiAlO_2$, $LiGaO_2$, GaN, or glass.

The substrate 110 may include a top surface 110U perpendicular to a first direction (Z direction in FIG. 1) and the first side surface 110S1 extending in a second direction (X direction in FIG. 1). For example, the top surface 110U of the substrate 110 may extend in the XY plane, and the first side surface 110S1 may extend in the XZ plane. FIG. 1 illustrates an example in which the top surface 110U of the substrate 110 is substantially perpendicular to the first side surface 110S1, but embodiments are not limited thereto. The first side surface 110S1 of the substrate 110 may be inclined at an angle other than 90° with respect to the top surface 110U of the substrate 110.

The substrate 110 may have a first height HZ1 in the first direction and a first width WX1 in the second direction. In embodiments, the first height HZ1 of the substrate 110 may range from about 5 μm to about 100 μm. The first width WX1 of the substrate 110 may range from about 10 μm to about 500 μm. However, the first height HZ1 and the first width WX1 of the substrate 110 are not limited thereto. For example, the first height HZ1 of the substrate 110 may be variously controlled according to a required light quantity and luminance of the light-emitting device 100. Also, the first width WX1 of the substrate 110 may be variously controlled according to a pixel size or pixel layout of a display device including the light-emitting device 100. Meanwhile, the first height HZ1 and the first width WX1 of the substrate 110 will be described in detail later.

The light-emitting structure 120 may be disposed on the first side surface 110S1 of the substrate 110, e.g., an area of a surface of the light-emitting structure 120 facing the first side surface 110S1 may equal and completely overlap an area of the first side surface 110S1. As illustrated in FIG. 2, the light-emitting structure 120 may include a first-conductivity-type semiconductor layer 122, an active layer 124, and a second-conductivity-type semiconductor layer 126. The first-conductivity-type semiconductor layer 122, the active layer 124, and the second-conductivity-type semiconductor layer 126 may be sequentially stacked on, e.g., directly on, the first side surface 110S1 of the substrate 110 in the second direction (Y direction).

In embodiments, the first-conductivity-type semiconductor layer 122 may include a nitride semiconductor that satisfies n-type, e.g., $In_xAl_yGa_{1-x-y}N$ (0≤x<1, 0≤y<1, 0≤x+y<1), and an n-type dopant, e.g., silicon (Si). For example, the first-conductivity-type semiconductor layer 122 may include n-type GaN.

Although not shown, the first-conductivity-type semiconductor layer 122 may have a stack structure of the first-conductivity-type semiconductor contact layer and a current diffusion layer. For example, the first-conductivity-type semiconductor contact layer may have a dopant concentration of about $2×10^{18}$ cm$^{-3}$ to about $9×10^{19}$ cm$^{-3}$, and a thickness of about 1 μm to about 5 μm. The current diffusion layer may have a structure formed by repeatedly stacking a plurality of $In_xAl_yGa_{(1-x-y)}N$ (0≤x, y≤1, 0≤x+y≤1) layers having different compositions or different dopant contents. For example, the current diffusion layer may be an n-type superlattice layer formed by repeatedly stacking at least two layers having different composition and a thickness of about 1 nm to about 500 nm, e.g., an n-type GaN layer and an $Al_xIn_yGa_zN$ (0≤x, y, z≤1, except that x=y=z=0) layer. The current diffusion layer may have a dopant concentration of about $2×10^{18}$ cm$^{-3}$ to about $9×10^{9}$ cm$^{-3}$. When necessary, an insulating material layer may be further introduced in the current diffusion layer.

In some embodiments, the second-conductivity-type semiconductor layer 126 may be a nitride semiconductor layer that satisfies a p-type, e.g., $In_xAl_yGa_{1-x-y}N$ (0≤x<1, 0≤y<1, 0≤x+y<1), and a p-type dopant, e.g., magnesium (Mg). For example, the second-conductivity-type semiconductor layer 126 may have a single structure or a multilayered structure having different compositions. Although not shown, the second-conductivity-type semiconductor layer 126 may include an electron blocking layer (EBL), a lightly doped p-type GaN layer, and a heavily doped p-type GaN layer serving as a contact layer, which are stacked sequentially. For example, the EBL may have a structure formed by stacking a plurality of $In_xAl_yGa_{(1-x-y)}N$ layers having different compositions, and each of the plurality of $In_xAl_yGa_{(1-x-y)}N$ layers may have a thickness of about 5 nm to about 100 nm. In another example, the EBL may be a single $Al_yGa_{(1-y)}N$ layer. An energy bandgap Eg of the EBL may be reduced far away from the active layer 124. For example, an Al content of the EBL may be reduced far away from the active layer 124.

The active layer 124 may have a multiple quantum well (MQW) structure formed by alternately stacking a quantum well layer and a quantum barrier layer. For example, the quantum well layer and the quantum barrier layer may be $In_xAl_yGa_{1-x-y}N$ (0≤x≤1, 0≤y≤1, 0≤x+y≤1) layers having different compositions. In embodiments, the quantum well layer may include $In_xGa_{1-x}N$ (0<x≤1), and the quantum barrier layer may include GaN or AlGaN. Each of the quantum well layer and the quantum barrier layer may have a thickness of about 1 nm to about 50 nm. The active layer 124 is not limited to an MQW structure but may be a single quantum well (SQW) structure.

The light-emitting structure 120 may emit first light having a first peak wavelength. The first peak wavelength may be included in a visible wavelength range of first color or an ultraviolet (UV) wavelength range. In embodiments, the first color may be blue. In other embodiments, the first color may be red, green, yellow, or purple.

Although not shown, a buffer layer may be interposed between the substrate 110 and the light-emitting structure 120. The buffer layer may include $In_xAl_yGa_{1-x-y}N$ ($0 \le x \le 1$, $0 \le y \le 1$). For example, the buffer layer may include GaN, AlN, AlGaN, or InGaN. When necessary, the buffer layer may be formed by stacking a plurality of layers or gradually changing a composition of the buffer layer.

As illustrated in FIGS. 1-2, the light-emitting device 100 may further include first and second electrodes 140 and 150 connected to the first and second-conductivity-type semiconductor layers 122 and 126, respectively. The first and second electrodes 140 and 150 may be disposed in the same direction such that the light-emitting device 100 is mounted as a flip-chip type.

In embodiments, the first electrode 140 may include a connection electrode unit 140a (e.g., a conductive via) connected, e.g., directly, to the first-conductivity-type semiconductor layer 122 through the second-conductivity-type semiconductor layer 126 and the active layer 124, and a first electrode pad 140b connected, e.g., directly, to the connection electrode unit 140a. The connection electrode unit 140a may be surrounded by an insulating layer 130 and electrically insulated from the active layer 124 and the second-conductivity-type semiconductor layer 126. The connection electrode unit 140a may be disposed in a region from which a stack structure of the first-conductivity-type semiconductor layer 122, the active layer 124, and the second-conductivity-type semiconductor layer 126 is etched. The number, shape, and pitch of connection electrode units 140a or a contact area between the connection electrode unit 140a and the first-conductivity-type semiconductor layer 122 may be appropriately designed so as to reduce a contact resistance between the connection electrode unit 140 and the first-conductivity-type semiconductor layer 122. Also, the connection electrode units 140a may be arranged in rows and columns on the stack structure so that the flow of current may be improved. The second electrode 150 may include an ohmic contact layer 150a and a second electrode pad 150b, which may be formed on the second-conductivity-type semiconductor layer 126, e.g., the ohmic contact layer 150a may be directly between the second electrode pad 150b and the second-conductivity-type semiconductor layer 126.

The connection electrode unit 140a and the ohmic contact layer 150a may include a single structure or a multilayered structure including a conductive material having ohmic characteristics with first and second-conductivity-type semiconductor layers 122 and 126, respectively. For example, each of the connection electrode unit 140a and the ohmic contact layer 150a may include a metal material, e.g., silver (Ag), aluminum (Al), nickel (Ni), titanium (Ti), tin (Sn), gold (Au), or chromium (Cr) or a transparent conductive material. The transparent conductive material may be at least one of, e.g., indium tin oxide (ITO), zinc-doped ITO (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), and $In_4Sn_3O_{12}$, and $Zn_{(1-x)}Mg_xO$ (zinc magnesium oxide, $0 \le x \le 1$).

The first and second electrode pads 140b and 150b may be respectively connected, e.g., directly, to the connection electrode units 140a and the ohmic contact layer 150a, and function as external terminals of the light-emitting device 100. For example, each of the first and second electrode pads 140b and 150b may include oat least one of gold (Au), silver (Ag), aluminum (Al), titanium (Ti), tungsten (W), copper (Cu), tin (Sn), nickel (Ni), platinum (Pt), chromium (Cr), nickel tin (NiSn), titanium tungsten (TiW), gold tin (AuSn), or a eutectic metal thereof.

The first and second electrodes 140 and 150 may be electrically insulated from one another by the insulating layer 130. The insulating layer 130 may include any material having electrical insulating characteristics. Although the insulating layer 130 includes any material having electrical insulating characteristics, the insulating layer 130 may include a material having a low light absorbance. For example, the insulating layer 130 may include silicon oxide or silicon nitride (e.g., $SiO_2$, $SiO_xN_y$, and $Si_xN_y$). When necessary, a light reflection structure may be formed by distributing a light reflective filler in a light transmissive material. In another example, the insulating layer 130 may have a multilayered reflective structure formed by alternately stacking a plurality of insulating layers having different refractive indices. For example, the multilayered reflective structure may be a distributed bragg reflector (DBR) formed by alternately stacking a first insulating layer having a first refractive index and a second insulating layer having a second refractive index.

The multilayered reflective structure may be stacked by repeatedly stacking a plurality of insulating layers having different refractive indices 2 to 100 times. For example, the plurality of insulating layers may be repeatedly stacked 3 to 70 times. Each of the plurality of insulating layers of the multilayered reflective structure may include an oxide or a nitride, e.g., $SiO_2$, SiN, $SiO_xN_y$, $TiO_2$, $Si_3N_4$, $Al_2O_3$, TiN, AlN, $ZrO_2$, TiAlN, or TiSiN, or a combination thereof. For example, assuming that light generated by the active layer has a wavelength of $\lambda$ and n is a refractive index of each of the first insulating layer and the second insulating layer, each of the first insulating layer and the second insulating layer may be formed to a thickness of $\lambda/4n$, e.g., a thickness of about 300 Å to about 900 Å. In this case, a refractive index and thickness of each of the first insulating layer and the second insulating layer may be selected such that the multilayered reflective structure has a high reflectance of about 95% or higher with respect to the wavelength of light generated by the active layer 124.

A refractive index of each of the first insulating layer and the second insulating layer may be determined in the range of about 1.4 to about 2.5, and may be less than a refractive index of the first-conductivity-type semiconductor layer 122 and a refractive index of the substrate 110. However, the refractive index of each of the first insulating layer and the second insulating layer may be less than the refractive index of the first-conductivity-type semiconductor layer 122 and more than the refractive index of the substrate 110.

In FIG. 1, a schematic path of first light emitted by the light-emitting structure 120 is illustrated with a dotted arrow. As shown in FIG. 1, first light, which is generated by the light-emitting structure 120 (or the active layer 124) and emitted out of the light-emitting structure 120, travels in various directions. For example, the first light emitted out of the light-emitting structure 120, e.g., the entire light emitted through the surface of the light-emitting structure 120 facing the first side surface 110S1, is transmitted through the first side surface 110S1 in all directions within the substrate 110.

Within the substrate 110, when first light is incident on the top surface 110U or any side surface in the YZ plane, e.g., the first side surface 110S1, of the substrate 110, the first light may be emitted out of the substrate 110. In particular, since the first width WX1 of the substrate 110 is larger than the first height HZ of the substrate 110, an emission area of first light emitted through the top surface 110U of the substrate 110 may be much larger than an emission area of first light emitted through any of the side surfaces, e.g., the first side surface 110S1, of the substrate 110.

In detail, as described above, the first height HZ1 of the substrate 110 may range from about 5 μm to about 100 μm, and the first width WX1 of the substrate 110 may range from about 10 μm to about 500 μm. Also, a second width WY1 of the substrate 110 in a third direction (Y direction in FIG. 1) may range from about 10 μm to about 500 μm. Thus, a ratio of the first width WX1 to the first height HZ1 may range from about 2:1 to 100:1, and a ratio of the second width WY1 to the first height WH1 may range from 2:1 to 100:1 Thus, a ratio of an area of the top surface 110U of the substrate 110 to an area of the first side surface 110S1 of the substrate 110 may range from about 2:1 to about 100:1. Also, a ratio of an area of the top surface 110U of the substrate 110 to an area of the light-emitting structure 120 disposed on the first side surface 110S1 may range from about 2:1 to about 100:1, i.e., a ratio of an area of the top surface 110U of the substrate 110 to an area of the light-emitting structure 120 facing and overlapping the first side surface 110S1. Accordingly, first light emitted by the light-emitting structure 120, e.g., through the entire area of the light-emitting structure 120 facing the first side surface 110S1, may be uniformly emitted through the top surface 110U of the substrate 110 having a relatively large area, e.g., a substantially larger area than any of the side surfaces. Due to the above-described characteristics, the substrate 110 may function as a light guide plate (LGP) that is unified with the light-emitting device 100.

In general, the amount of light required for one of a plurality of pixels of a display device may be obtained from an LED having a size of about 10 μm×10 μm. However, since the LED has a much smaller size than one pixel, when one pixel includes one LED, the LED may be a point light source. For example, a bright point having a high luminance may occur in a portion of the pixel disposed close to the LED. Thus, the pixel may have a non-uniform luminance, and light having a uniform light amount may not be provided to the entire pixel. When an additional optical system (e.g., a diffuser or a diffusing lens) is adhered between the LED and the pixel, light having a relatively uniform light amount may be provided to the pixel. However, the thickness and weight of the display device may increase by adhering the diffuser or the diffusing lens, so that it may be difficult to obtain a compact display device.

In contrast, in the above-described light-emitting device 100, first light emitted by the light-emitting structure 120 formed on the first side surface 110S1 of the substrate 110 may be uniformly emitted through the top surface 110U of the substrate 110 above the light-emitting device 100. Thus, even if the light-emitting structure 120 has a relatively small size, the light-emitting device 100 may be used as a plane light source without installing an additional optical system, e.g., a diffuser. Accordingly, the light-emitting device 100 may emit uniform light over a large emission area, e.g., uniform light through an entire top surface 110U of the substrate 110.

Figure 3:
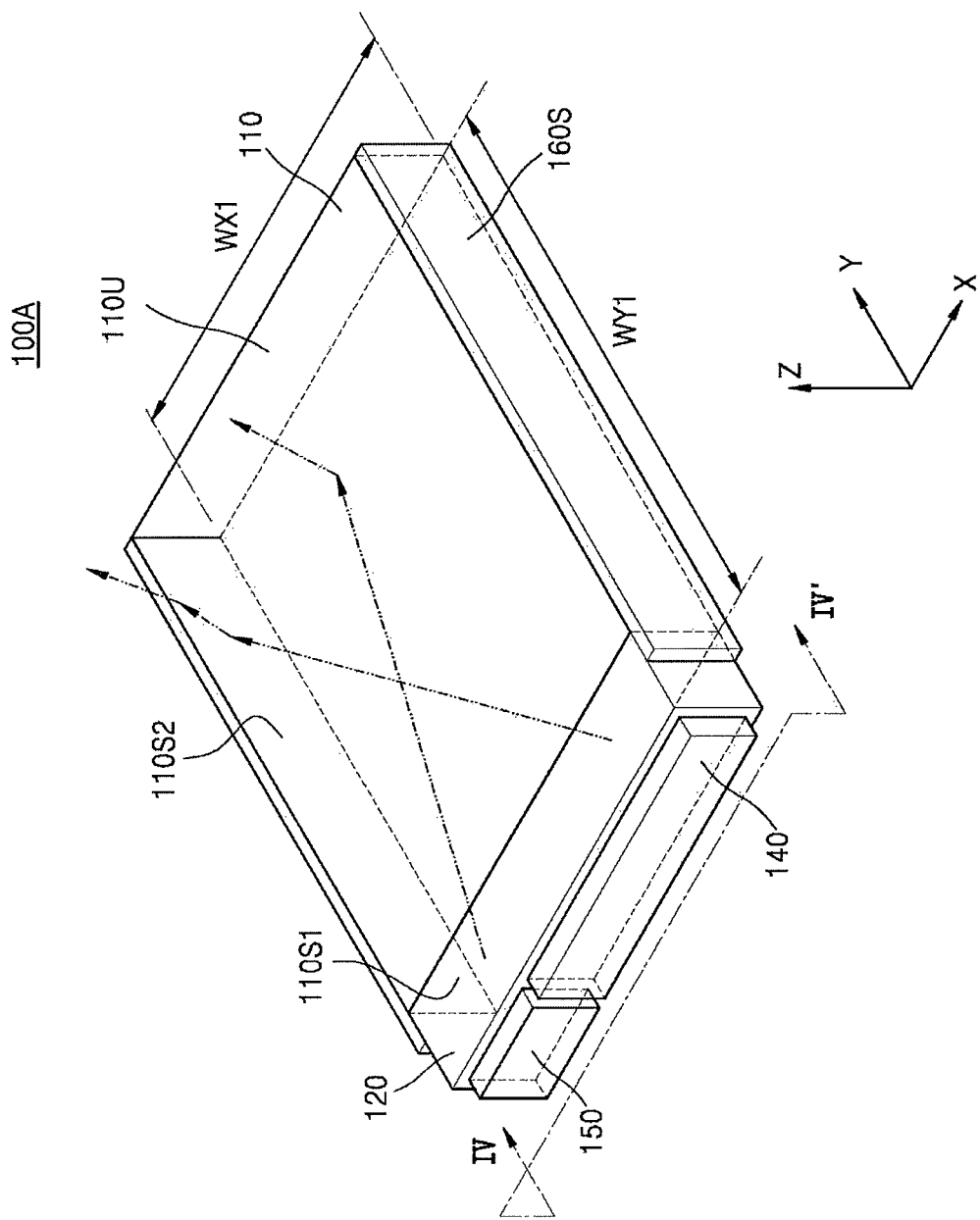
FIG. 3 illustrates a perspective view of a light-emitting device according to an embodiment.
Figure 4:
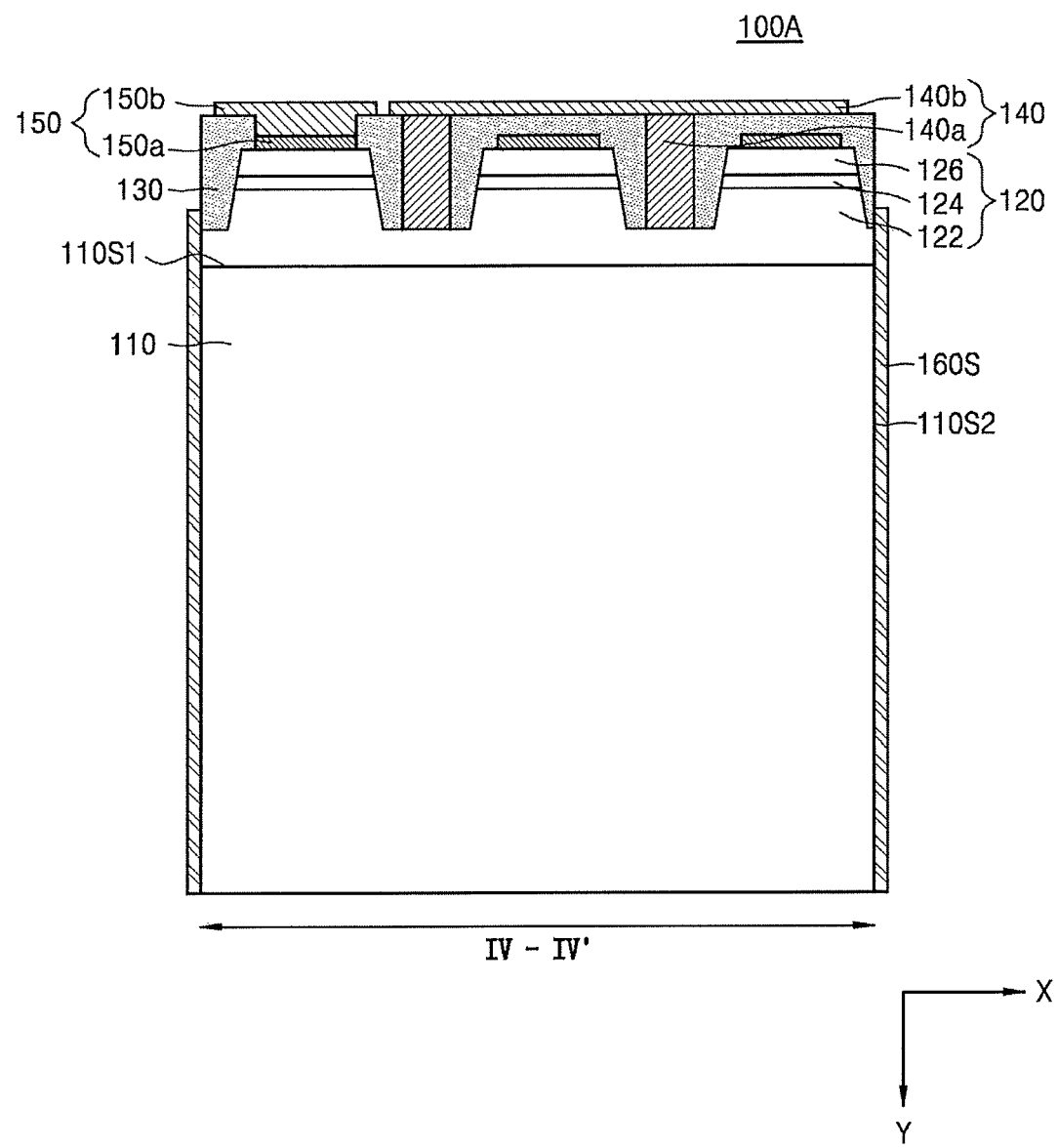
FIG. 4 illustrates a cross-sectional view taken along line IV-IV' of FIG. 3.

FIG. 3 is a perspective view of a light-emitting device 100A according to an embodiment, and FIG. 4 is a cross-sectional view taken along a line IV-IV' of FIG. 3. In FIGS. 3 and 4, the same reference numerals are used to denote the same elements as in FIGS. 1 and 2.

Referring to FIGS. 3 and 4, the light-emitting device 100A may include a side reflective layer 160S formed on a second side surface 110S2 of the substrate 110.

In embodiments, the substrate 110 may include a top surface 110U perpendicular to a first direction (Z direction in FIG. 3), a first side surface 110S1 extending in a second direction (X direction in FIG. 3), and a second side surface 110S2 extending in a third direction (Y direction in FIG. 3). The side reflective layer 160S may be disposed, e.g., directly, on the second side surface 110S2 of the substrate 110 and prevent first light traveling toward the second side surface 110S2 of the substrate 110 from being emitted toward the second side surface 110S2. For example, the side reflective layer 160S may reflect first light, which is generated by the light-emitting structure 120 and emitted toward the second side surface 110S2 of the substrate 110, into the substrate 110 (dotted arrow in FIG. 3 reflected away from the second side surface 110S2 toward an interior of the substrate 110).

In embodiments, the side reflective layer 160S may include a metal material, e.g., aluminum (Al), silver (Ag), nickel (Ni), gold (Au), platinum (Pt), titanium (Ti), tungsten (W), iridium (Ir), ruthenium (Ru), tantalum (Ta), vanadium (V), Co (cobalt), osmium (Os), or rhenium (Re). In other embodiments, the side reflective layer 160S may include a multilayered reflective structure formed by alternately stacking a plurality of dielectric layers having different refractive indices. In other embodiments, the side reflective layer 160S may include a light reflective structure formed by dispersing a light reflective filler in a light transmissive material. For example, the formation of the side reflective layer 160S may include forming a mask on a top surface of the light-emitting device 100A and forming a metal layer having a thickness on the second side surface 110S2 of the substrate 110 by using a spray process. However, a method of forming the side reflective layer 160S is not limited thereto.

As shown in FIG. 4, the side reflective layer 160S may extend in the third direction (Y direction in FIG. 4) and cover a portion of a side surface of the light-emitting structure 120, e.g., the side reflective layer 160S may extend along an entirety of the second side surface 110S2 and beyond the second side surface 110S2 to completely cover the second side surface 110S2. The side reflective layer 160S extending to, e.g., cover at least a portion of, the side surface of the light-emitting structure 120 may prevent first light emitted by the active layer 124 from being emitted outside. In another example, an additional reflective layer may be disposed on the surface of the light-emitting structure 120, e.g., a side surface of the active layer 124. The side reflective layer 160S may be disposed on the side surfaces of the light-emitting structure 120 and the substrate 110 so that the amount of first light externally emitted through the top surface 110U of the substrate 110, from among the total amount of first light generated by the light-emitting structure 120, may increase. Accordingly, the light-emitting device 100A may have improved optical extraction efficiency.

Figure 5:
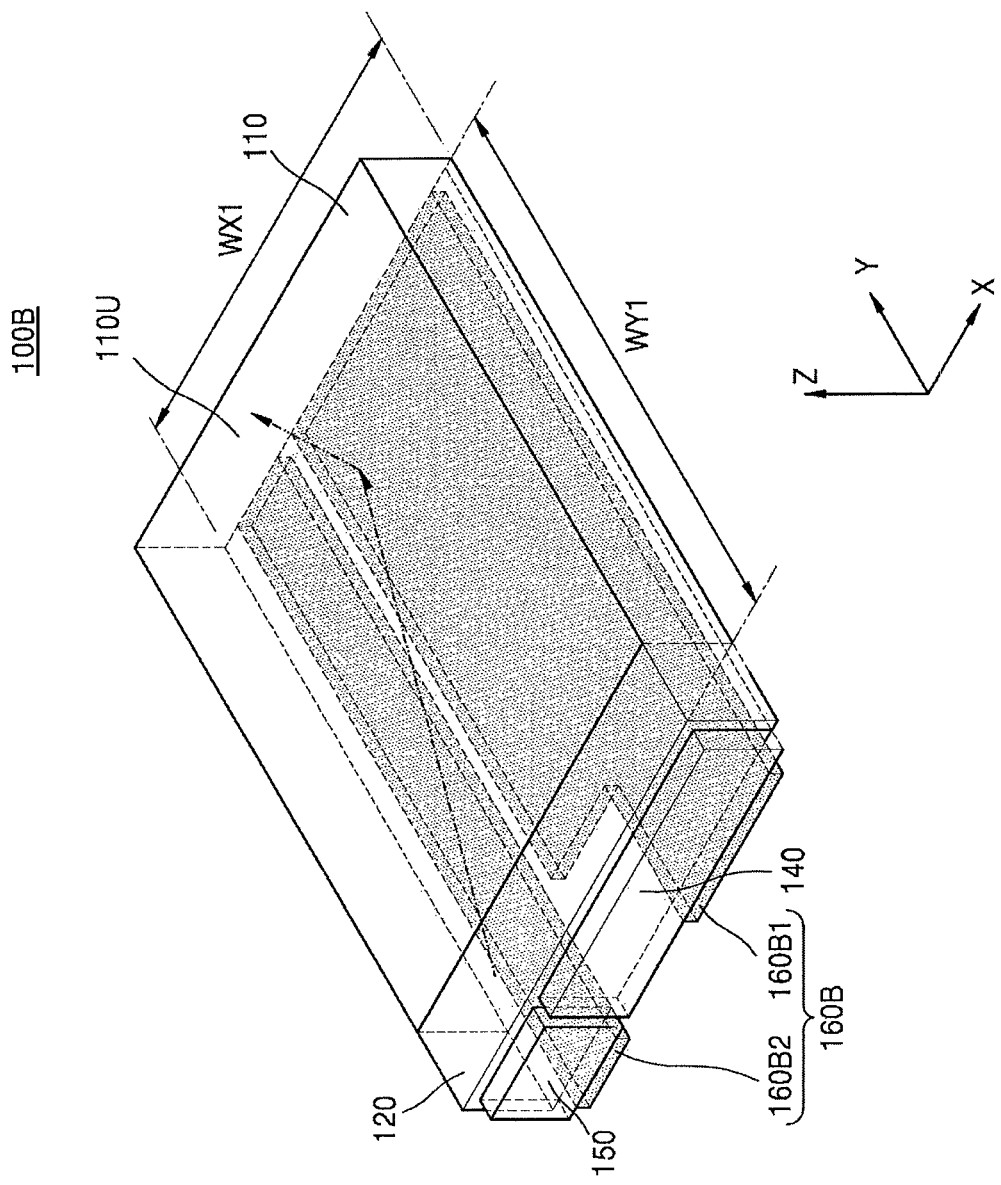
FIG. 5 illustrates a perspective view of a light-emitting device according to an embodiment.

FIG. 5 is a perspective view of a light-emitting device 100B according to an embodiment. In FIG. 5, the same reference numerals are used to denote the same elements as in FIGS. 1 to 4. The light-emitting device 100B is similar to the light-emitting device 100 described with reference to FIGS. 1 and 2, except that the light-emitting device 100B further includes a bottom reflective layer 160B formed on a bottom surface of the substrate 110. Accordingly, the above-described difference will mainly be described.

Referring to FIG. 5, the bottom reflective layer 160B may be formed, e.g., directly, on a bottom surface of the substrate 110, e.g., the bottom surface of the substrate 110 is opposite to the top surface 110U. The bottom reflective layer 160B may external to the substrate 110, and may prevent first light, which is generated by the light-emitting structure 120 and travels toward the bottom surface of the substrate 110, from being emitted through the bottom surface of the substrate 110. For example, the bottom reflective layer 160B may reflect first light, which is generated by the light-emitting structure 120 and emitted downward through the bottom surface of the substrate 110, back into the interior of the substrate 110 so that the amount of light emitted toward the top surface 110U of the substrate 110 may increase. Accordingly, the light-emitting device 100B may have improved optical extraction efficiency. In embodiments, the bottom reflective layer 160B may include a metal material, e.g., one or more of Al, Ag, Ni, Au, Pt, Ti, W, Ir, Ru, Ta, V, Co, Os, or Re. However, a material included in the bottom reflective layer 160B is not limited thereto.

In embodiments, the bottom reflective layer 160B may include a first bottom reflective layer 160B1 and a second bottom reflective layer 160B2, which may be spaced apart from one another. The first bottom reflective layer 160B1 and the second bottom reflective layer 160B2 may be connected to the first electrode 140 and the second electrode 150, respectively. For example, the first bottom reflective layer 160B1 may extend from the bottom surface of the substrate 110 to the first electrode 140, while the second bottom reflective layer 160B2 may extend from the bottom surface of the substrate 110 to the second electrode 150. For example, as illustrated in FIG. 5, the first bottom reflective layer 160B1 may extend in the Y-axis direction, e.g., continuously, along the entirety of the length of the bottom surface of the substrate 110 and along the entirety of the length of the light-emitting structure 120 to contact the first electrode 140. Similarly, the second bottom reflective layer 160B2 may extend in the Y-axis direction, e.g., continuously, along the entirety of the length of the bottom surface of the substrate 110 and along the entirety of the length of the light-emitting structure 120 to contact the second electrode 150. The first and second bottom reflective layers 160B1 and 160B2 may function as external terminals of the light-emitting device 100B along with the first and second electrodes 140 and 150. Although not shown, an under bump metal (UBM) layer and a solder bump layer may be further formed under the bottom reflective layers 160B1 and 160B2. The UBM layer may increase interfacial bonding strength between the bottom reflective layers 160B 1 and 160B2 of the light-emitting device 100 and the solder bump layer and provide an electrical path. Also, the UBM layer may prevent solder from diffusing into the bottom reflective layers 160B1 and 160B2 during a reflow process.

In the light-emitting device 100B, the bottom reflective layer 160B may be disposed on bottom surfaces of the light-emitting structure 120 and the substrate 110 so that the amount of first light externally emitted through the top surface of the substrate 110, from among total amount of first light generated by the light-emitting structure 120, may increase. Accordingly, the light-emitting device 100B may have improved optical extraction efficiency.

FIG. 6 is a cross-sectional view of a light-emitting device 100C according to an embodiment. FIG. 6 is a cross-sectional view taken along line II-II' of FIG. 1. In FIG. 6, the same reference numerals are used to denote the same elements as in FIGS. 1 to 5. The light-emitting device 100C is similar to the light-emitting device 100 described with reference to FIGS. 1 and 2, except that the light-emitting device 100C further includes an optical wavelength conversion layer 170 formed on a side surface of the substrate 110. Accordingly, the above-described differences will mainly be described.

Referring to FIG. 6, an uneven portion P may be formed on a top surface of the light-emitting structure 120 (i.e., on a top surface of the first-conductivity-type semiconductor layer 122 facing the first side surface 110S1 of the substrate 110). For example, the uneven portion P may include a rough surface between the light-emitting structure 120 and the substrate 110, e.g., the rough surface may directly contact the first-conductivity-type semiconductor layer 122 of the light-emitting structure 120. The uneven portion P may increase extraction efficiency of light emitted by the light-emitting device 100C.

In an example of a process of forming the light-emitting device 100C, the first-conductivity-type semiconductor layer 122, the active layer 124, and the second-conductivity-type semiconductor layer 126 may be sequentially formed on a growth substrate, in which an uneven portion is formed, the growth substrate may be turned over and removed, and the uneven portion P may be formed in a top surface of the first-conductivity-type semiconductor layer 122. The uneven portion P may improve single-crystalline quality of the second-conductivity-type semiconductor layer 126.

The optical wavelength conversion layer 170 may be interposed between the light-emitting structure 120 and the substrate 110, e.g., the optical wavelength conversion layer 170 may be between the substrate 110 and the uneven portion P. The optical wavelength conversion layer 170 may absorb first light having a first peak wavelength emitted by the light-emitting structure 120 and emit second light having a second peak wavelength. The second peak wavelength may be different from the first peak wavelength and included in a visible wavelength range of a second color that is different from a first color. For example, the first color may be blue color, the second color may be one of red color, green color, or yellow color. In other embodiments, when color of the first light emitted by the light-emitting structure 120 is one of red color, green color, or yellow color, second color, which is color of light emitted by the optical wavelength conversion layer 170, may be blue color.

The optical wavelength conversion layer 170 may include a wavelength conversion material for converting the wavelength of the first light emitted by the light-emitting structure 120. Various materials, e.g., phosphors and/or quantum dots (QDs), may be used for the optical wavelength conversion layer 170.

The phosphors used for the optical wavelength conversion layer 170 may have the following empirical formulas and colors.

Oxide-based: yellow and green color $Y_3Al_5O_{12}$:Ce, $Tb_3Al_5O_{12}$:Ce, $Lu_3Al_5O_{12}$:Ce.

Silicate-based: yellow color and green color $(Ba,Sr)_2SiO_4$:Eu, yellow color and orange color $(Ba,Sr)_3SiO_5$:Ce.

Nitride-based: green color $\beta$-SiAlON:Eu, yellow color $La_3Si_6O_{11}$:Ce, orange color $\alpha$-SiAlON:Eu, red color $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, 0<y≤4) Formula (1)

In Formula (1), Ln may be at least one element of Group IIIa elements and rare-earth elements, and M may be at least one element of calcium (Ca), barium (Ba), strontium (Sr), and magnesium (Mg).

Fluoride-based: KSF-based red color $K_2SiF_6:Mn_4^+$, $K_2TiF_6:Mn_4^+$, $NaYF_4:Mn_4^+$, $NaGdF_4:Mn_4^+$, $K_3SiF_7:Mn_4^+$.

The compositions of the phosphors need to basically conform with stoichiometry, and the respective elements may be substituted by other elements included in the respective groups of the periodic table. For example, strontium (Sr) may be substituted by at least one of barium (Ba), calcium (Ca), and magnesium (Mg) of alkaline-earth group II, and Y may be substituted by at least one of terbium (Tb), lutetium (Lu), scandium (Sc), and gadolinium (Gd). In addition, europium (Eu), which is an activator, may be substituted by at least one of cerium (Ce), terbium (Tb), praseodymium (Pr), erbium (Er), and ytterbium (Yb) according to a desired energy level. The activator may be applied solely or a sub-activator may be additionally applied for characteristic modification.

In particular, a fluoride-based red phosphor may be coated with a Manganese-free fluoride to improve reliability at a high temperature and a high humidity. Alternatively, the surface of the fluoride-based red phosphor or the surface of the manganese-free fluoride coating layer may be further coated with an organic material. Unlike other phosphors, the fluoride-based red phosphor may embody a narrow full width at half-maximum (FWHM) of about 40 nm or less and be applied to a high-resolution TV, such as an ultrahigh-definition (UHD) TV.

The following Table 1 shows types of phosphors in respective fields, which may be used as wavelength conversion materials when a peak wavelength of light emitted by the light-emitting structure 120 is in a blue visible wavelength range of about 440 nm to about 460 nm or a UV wavelength range of about 380 nm to about 440 nm.

the QD may include a core, e.g., CdSe or InP, and a shell, e.g., ZnS and ZnSe. For example, the core may have a diameter of about 1 nm to about 30 nm, e.g., about 3 nm to about 10 nm. The shell may have a thickness of about 0.1 nm to about 20 nm, e.g., about 0.5 nm to about 2 nm. Also, the QD may include a ligand for stabilizing the core and the shell.

The QDs may be embodied in various colors according to size. In particular, when the QDs are used instead of a phosphor, the QDs may be used as a wavelength conversion material capable of emitting red light or green light. When the QDs are used as a wavelength conversion material, a narrow FWHM of about 35 nm may be achieved.

Referring back to FIG. 6, the substrate 110 may include a light-transmissive insulating substrate, e.g., a glass substrate, an $Al_2O_3$ substrate, or a sapphire substrate. As described above, in an exemplary process of forming the light-emitting device 100C, the light-emitting structure 120 may be formed on a growth substrate, and after the growth substrate is removed, the light-emitting structure 120 may be adhered to the top surface 110U of the substrate 110. Accordingly, a kind of the substrate 110 may be variously selected, and an optical wavelength conversion layer 170 may be formed between the substrate 110 and the light-emitting structure 120. In the light-emitting device 100C, the uneven portion P may be formed between the light-emitting structure 120 and the optical wavelength conversion layer 170 to improve optical extraction efficiency.

Figure 7:
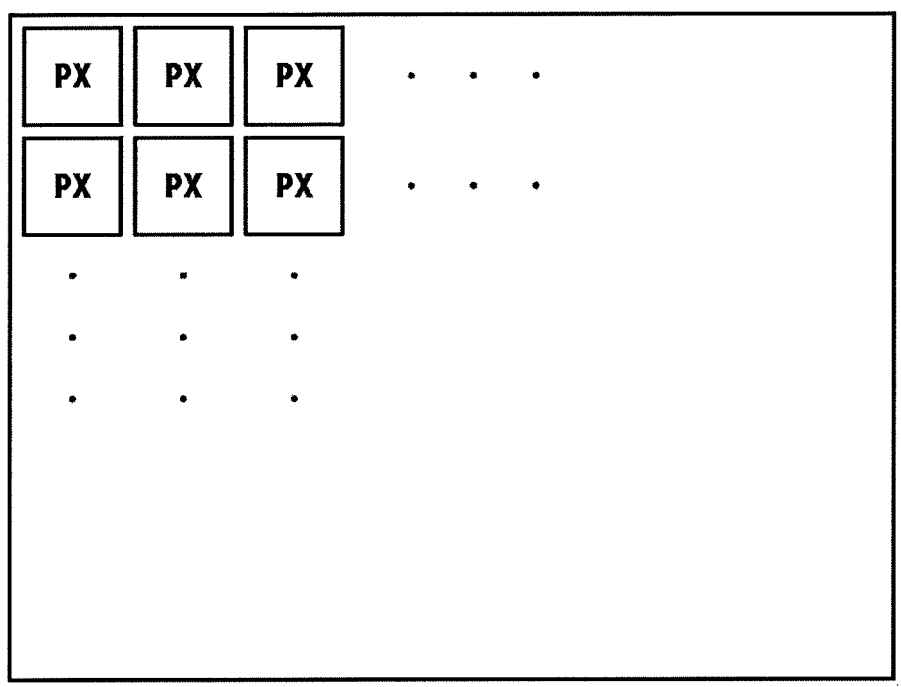
FIG. 7 illustrates a block diagram of a display device including a light-emitting device according to an embodiment.
Figure 8:
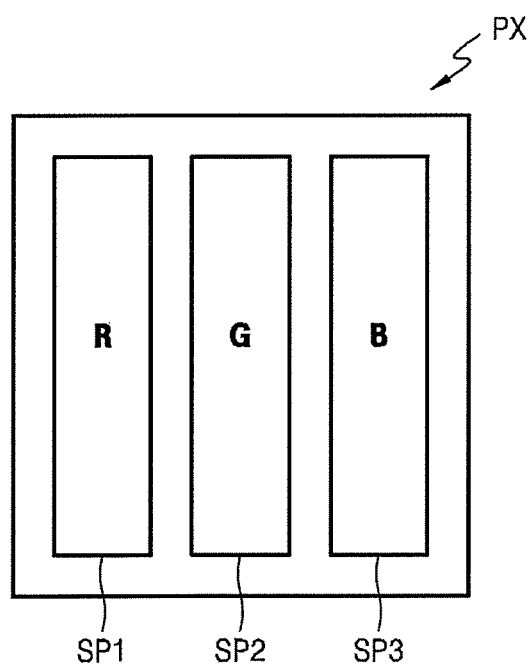
FIG. 8 illustrates a block diagram of a pixel of the display device of FIG. 7.

FIG. 7 is a schematic block diagram of a display device 200 including a light-emitting device according to an embodiment. FIG. 8 is a schematic block diagram of a pixel of the display device of FIG. 7.

TABLE 1

| Purpose | Phosphor | Purpose | Phosphor |
| --- | --- | --- | --- |
| LED TV BLU | β-SiAlON:Eu2+<br>(Ca, Sr)AlSiN$_3$:Eu2+<br>La$_3$Si$_6$N$_{11}$:Ce3+<br>K$_2$SiF$_6$:Mn4+<br>SrLiAl3N4:Eu<br>Ln$_{4-x}$(Eu$_z$M$_{1-z}$)$_x$Si$_{12-y}$Al$_y$O$_{3+x+y}$N$_{18-x-y}$<br>(0.5 ≤ x ≤ 3, 0 < z < 0.3, 0 < y ≤ 4)<br>K2TiF6:Mn4+<br>NaYF4:Mn4+<br>NaGdF4:Mn4+ | Side View<br>(Mobile,<br>Note PC) | Lu$_3$Al$_5$O$_{12}$:Ce3+<br>Ca-α-SiAlON:Eu2+<br>La$_3$Si$_6$N$_{11}$:Ce3+<br>(Ca, Sr)AlSiN$_3$:Eu2+<br>Y$_3$Al$_5$O$_{12}$:Ce3+<br>(Sr, Ba, Ca, Mg)2SiO4:Eu2+<br>K$_2$SiF$_6$:Mn4+<br>SrLiAl3N4:Eu<br>Ln$_{4-x}$(Eu$_z$M$_{1-z}$)$_x$Si$_{12-y}$Al$_y$O$_{3+x+y}$N$_{18-x-y}$<br>(0.5 ≤ x ≤ 3, 0 < z < 0.3, 0 < y ≤ 4)<br>K2TiF6:Mn4+<br>NaYF4:Mn4+<br>NaGdF4:Mn4+ |
| Illumination | Lu$_3$Al$_5$O$_{12}$:Ce3+<br>Ca-α-SiAlON:Eu2+<br>La$_3$Si$_6$N$_{11}$:Ce3+<br>(Ca, Sr)AlSiN$_3$:Eu2+<br>Y$_3$Al$_5$O$_{12}$:Ce3+<br>K$_2$SiF$_6$:Mn4+<br>SrLiAl3N4:Eu<br>Ln$_{4-x}$(Eu$_z$M$_{1-z}$)$_x$Si$_{12-y}$Al$_y$O$_{3+x+y}$N$_{18-x-y}$<br>(0.5 ≤ x ≤ 3, 0 < z < 0.3, 0 < y ≤ 4)<br>K2TiF6:Mn4+<br>NaYF4:Mn4+<br>NaGdF4:Mn4+ | Interior<br>(Head Lamp,<br>etc.) | Lu$_3$Al$_5$O$_{12}$:Ce3+<br>Ca-α-SiAlON:Eu2+<br>La$_3$Si$_6$N$_{11}$:Ce3+<br>(Ca, Sr)AlSiN$_3$:Eu2+<br>Y$_3$Al$_5$O$_{12}$:Ce3+<br>K$_2$SiF$_6$:Mn4+<br>SrLiAl3N4:Eu<br>Ln$_{4-x}$(Eu$_z$M$_{1-z}$)$_x$Si$_{12-y}$Al$_y$O$_{3+x+y}$N$_{18-x-y}$<br>(0.5 ≤ x ≤ 3, 0 < z < 0.3, 0 < y ≤ 4)<br>K2TiF6:Mn4+<br>NaYF4:Mn4+<br>NaGdF4:Mn4+ |

In addition, QDs may be used for the optical wavelength conversion layer 170 as a wavelength conversion material capable of replacing phosphors or in combination with the phosphors.

Figure 21:
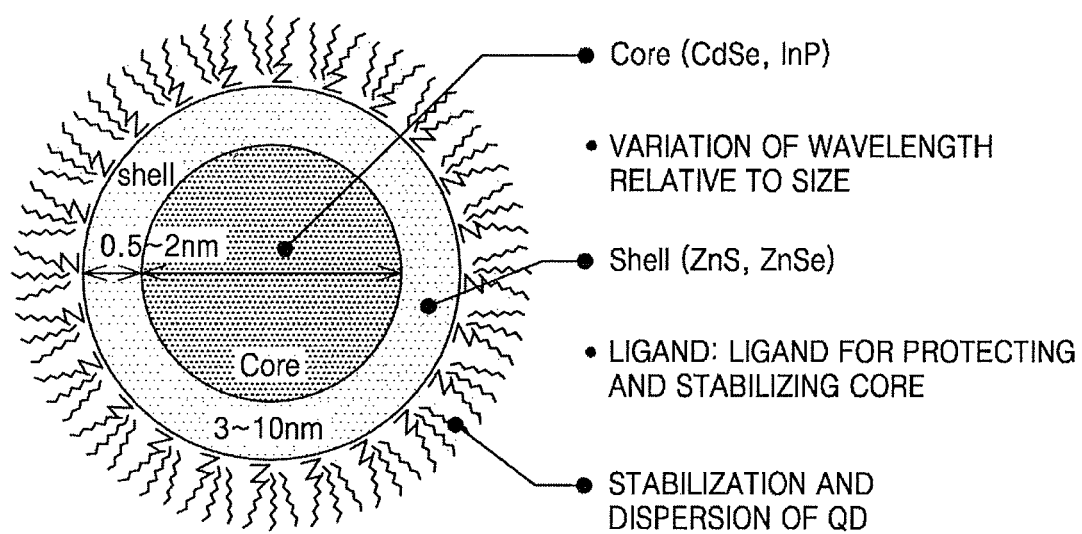
FIG. 21 illustrates a schematic view of a sectional structure of a quantum dot.

FIG. 21 is a schematic view of a sectional structure of a QD according to an embodiment.

Referring to FIG. 21, the QD may have a core-shell structure by using a Group III-V compound semiconductor or a Group II-VI compound semiconductor. For example, Referring to FIGS. 7 and 8, the display device 200 may include a plurality of pixels PX. The plurality of pixels PX may be arranged in rows and columns.

Each of the plurality of pixels PX may include three sub-pixels. Each of the plurality of pixels PX may include red, green, and blue sub-pixels. For example, a first sub-pixel SP1 may emit red light, a second sub-pixel SP2 may emit green light, and a third sub-pixel SP3 may emit blue light.

FIG. 8 illustrates an example in which the first to third sub-pixels SP1, SP2, and SP3 are arranged apart from one another in a row in one pixel PX, but embodiments are not limited thereto. The first sub-pixel SP1 may include a first light-emitting device configured to emit first light, and the second sub-pixel SP2 may include a second light-emitting device configured to emit second light. The third sub-pixel SP3 may include a third light-emitting device configured to emit third light. In embodiments, the first light may be red light, the second light may be green light, and the third light may be blue light.

In embodiments, the first to third light-emitting devices may emit first to third light having respectively different peak wavelengths. For example, a light-emitting structure of the first light-emitting device may emit first light having a first peak wavelength. The first peak wavelength may be included in a visible wavelength range of a first color, and the first color may be red. A light-emitting structure of the second light-emitting device may emit second light having a second peak wavelength other than the first peak wavelength, and second color of the second light may be green. Also, a light-emitting structure of the third light-emitting device may emit third light having a third peak wavelength other than the first and second peak wavelengths, and third color of the third light may be blue. The first to third light-emitting devices may have similar structures to the light-emitting devices 100, 100A, and 100B described with reference to FIGS. 1 to 5.

In other embodiments, the light-emitting structures of the first to third light-emitting devices may emit first light having the same peak wavelength, and color of the first light may be blue. The first light-emitting device may further include an optical wavelength conversion layer, which may absorb first light having a first peak wavelength generated by the light-emitting structure and emit second light having a second peak wavelength other than the first peak wavelength. Color of the second light may be red. Also, the second light-emitting device may further include an optical wavelength conversion layer, which may absorb the first light having the first peak wavelength generated by the light-emitting structure and emit third light having a third peak wavelength other than the first peak wavelength. Color of the third light may be green. The third light-emitting device may not include an optical wavelength conversion layer but emit first light. Color of the first light is not limited to blue light and may be red light or green light. Here, the first and second light-emitting devices may have a similar structure to the light-emitting device 100C described with reference to FIG. 6, and the third light-emitting device may have a similar structure to the light-emitting devices 100, 100A, and 100B described with reference to FIGS. 1 to 5.

In this case, all the first to third light-emitting structures of the first to third sub-pixels SP1, SP2, and SP3 may have substantially the same structure and material composition. For example, the first to third light-emitting structures may operate by using the same driving power source and emit first light of the same color. Since the third sub-pixel SP3 does not include an optical wavelength conversion layer unlike the first and second sub-pixels SP1 and SP2, the third sub-pixel SP3 may have higher luminous efficiency than the first and second sub-pixels SP1 and SP2. Also, a planar area of each of the first and second sub-pixels SP1 and SP2 may be larger than a planar area of the third sub-pixel SP3 so that all the first to third sub-pixels SP1, SP2, and SP3 may have the same maximum luminance. However, structures, arrangements, and sizes of the light-emitting devices of the first to third sub-pixels SP1, SP2, and SP3 are not limited to those described above.

Figure 9:
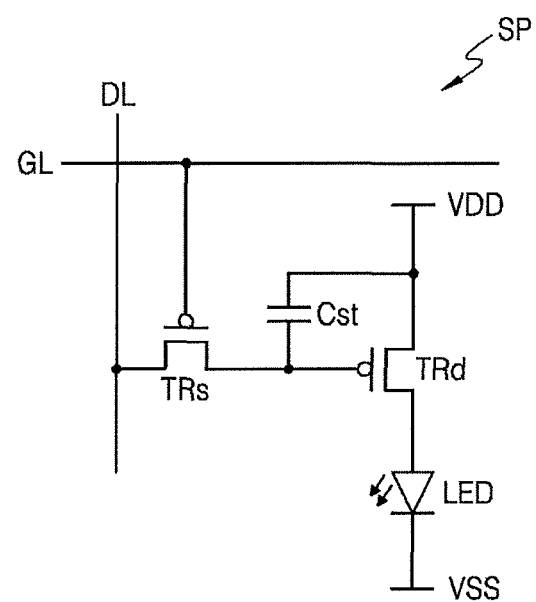
FIG. 9 illustrates an equivalent circuit diagram of a sub-pixel shown in FIG. 8.

FIG. 9 is an equivalent circuit diagram of an example of a sub-pixel SP shown in FIG. 8.

Referring to FIG. 9, a sub-pixel SP may include a switching transistor TRs, a driving transistor TRd, and a storage capacitor Cst. The driving transistor TRd may generate a driving current between a first driving power source VDD and a second driving power source VSS and output the driving current to a light-emitting device LED. The light-emitting device LED may include one of the first to third light-emitting structures. As described above, when all the first to third light-emitting structures are driven due to the same driving power source, a pixel circuit or a voltage level of a driving power source may not vary according to the kind of the sub-pixel SP.

The switching transistor TRs may be connected to a gate line GL to which a scan signal is transmitted and a data line DL to which a data signal is transmitted. The switching transistor TRs may store a data signal in the storage capacitor Cst in response to a scan signal. The storage capacitor Cst may temporarily store the data signal transmitted from the switching transistor TRs and maintain a gate-source voltage of the driving transistor TRd constant for one frame. The driving transistor TRd may control a magnitude of current supplied from the first driving power source VDD through the light-emitting device LED to the second driving power source VSS in response to the data signal transmitted from the switching transistor TRs. Thus, the light-emitting device LED may emit light with luminance corresponding to the data signal.

Figure 10:
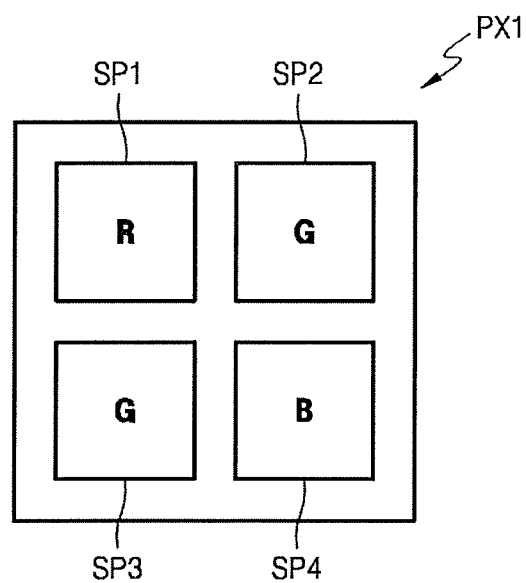
FIG. 10 illustrates a block diagram of a pixel of a display device according to an embodiment.

FIG. 10 is a block diagram of a pixel PX1 of a display device according to an embodiment.

Referring to FIG. 10, the pixel PX1 may include four sub-pixels SP1, SP2, SP3, and SP4, which are aligned by a Bayer pattern. For example, the first sub-pixel SP1 may be a red sub-pixel, the second and third sub-pixels SP2 and SP3 may be green sub-pixels, and the fourth sub-pixel SP4 may be a blue sub-pixel. However, embodiments are not limited thereto. Unlike shown in FIG. 10, the first to fourth sub-pixels SP1, SP2, SP3, and SP4 may be red, green, blue, and white sub-pixels, respectively.

Figure 11:
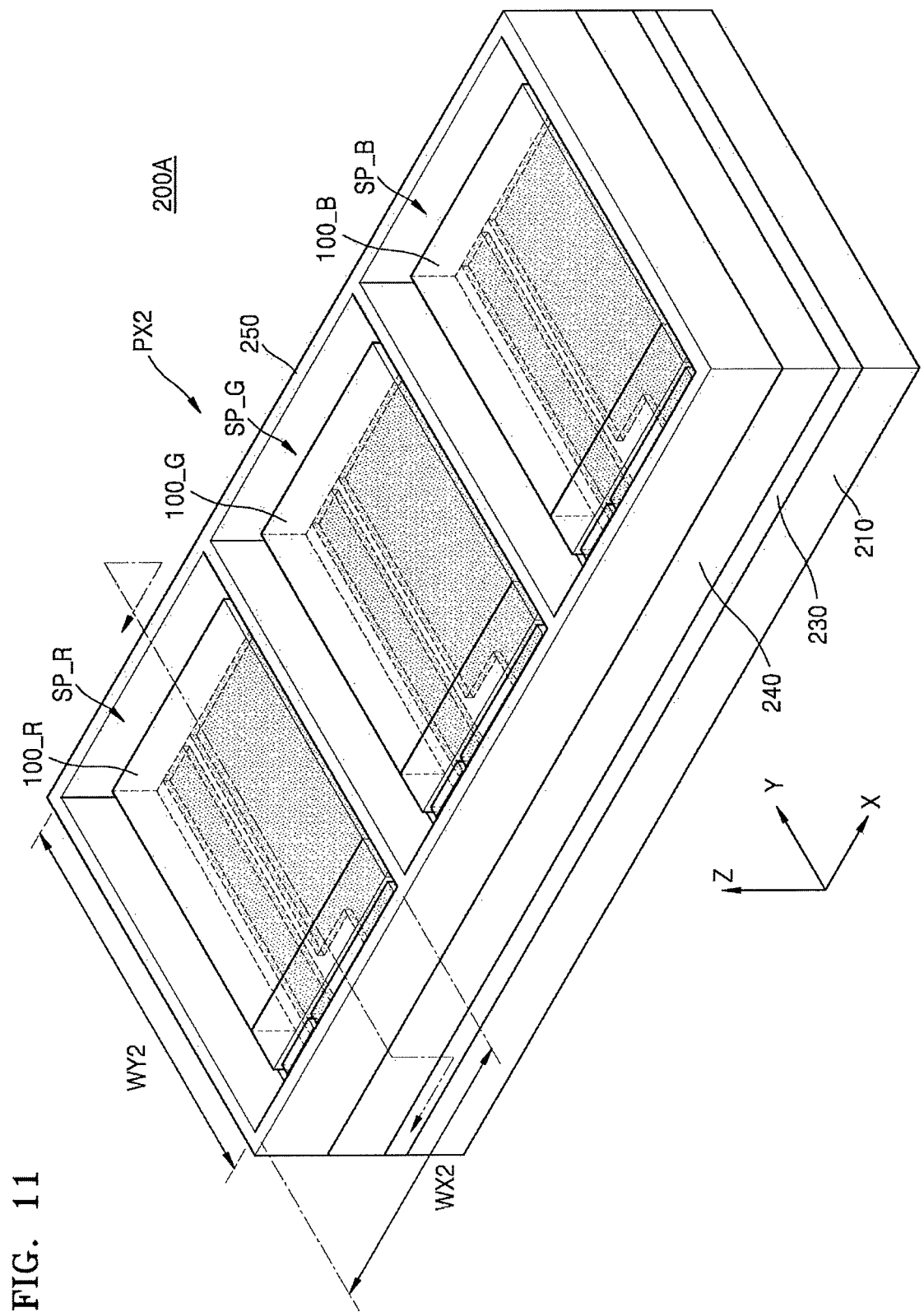
FIG. 11 illustrates a perspective view of a display device according to an embodiment.
Figure 12:
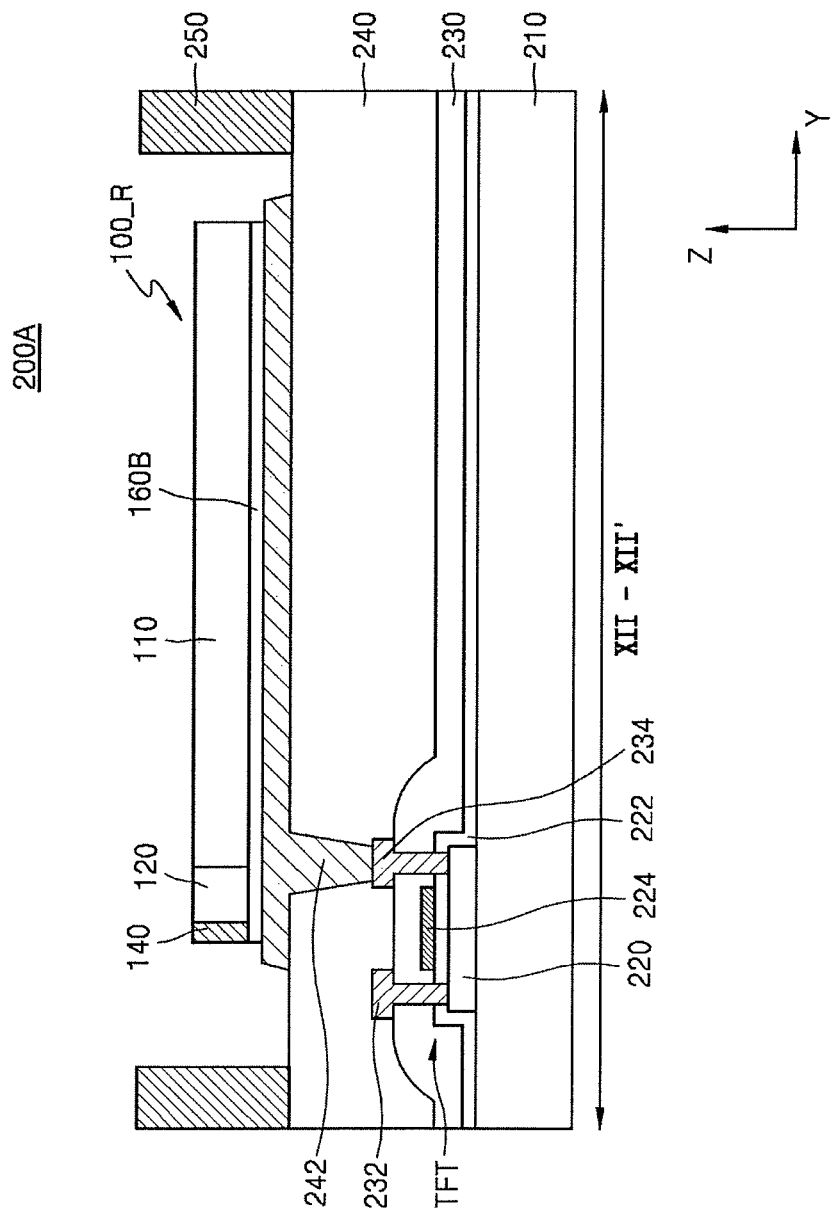
FIG. 12 illustrates a cross-sectional view taken along line XI-XI' of FIG. 11.

FIG. 11 is a perspective view of a display device 200A according to an embodiment. FIG. 12 is a cross-sectional view taken along line XI-XI' of FIG. 11. In FIGS. 11 and 12, the same reference numerals are used to denote the same elements as in FIGS. 1 to 10.

Referring to FIGS. 11 and 12, the display device 200A may include a driver TFT formed on a lower substrate 210 and first to third light-emitting devices 100_R, 100_G, and 100_B electrically connected to the driver TFT.

The driver TFT may include a semiconductor layer 220 formed on the lower substrate 210, a gate insulating layer 222 covering the semiconductor layer 220 on the lower substrate 210, a gate electrode 224 formed on the gate insulating layer 222, an insulating interlayer 230 covering the gate insulating layer 222 and the gate electrode 224, a source electrode 232 and a drain electrode 234 formed through the insulating interlayer 230 and connected to a source region and a drain region of the semiconductor layer 220, respectively, a protection layer 240 covering the insulating interlayer 230, and a lower electrode 242 formed through the protection layer 240 and connected to the drain electrode 234.

FIG. 12 illustrates an example in which the semiconductor layer 220 is formed under the gate electrode 224 in the driver TFT, but the gate electrode 224 may be formed under the semiconductor layer 220. Also, FIG. 12 illustrates an example in which the lower electrode 242 is connected to the drain electrode 234, but the lower electrode 242 may be connected to the source electrode 232.

The first to third light-emitting devices 100_R, 100_G, and 100_B may be disposed on the lower electrode 242. The first to third light-emitting devices 100_R, 100_G, and 100_B may have similar technical features to the light-emitting devices 100, 100A, 100B, and 100C described with reference to FIGS. 1 to 6.

Although not shown, an adhesive layer or a eutectic metal layer may be further formed between the first to third light-emitting devices 100_R, 100_G, and 100_B and the lower electrode 242. The first electrode 140 of each of the first to third light-emitting devices 100_R, 100_G, and 100_B may be electrically connected to the lower electrode 242 so that power and signals may be transmitted from the driver TFT to each of the first to third light-emitting devices 100_R, 100_G, and 100_B, e.g., each of the first to third light-emitting devices 100_R, 100_G, and 100_B may be connected to a separate driver TFT and lower electrode 242. Although not shown, a protection layer may be further formed to cover side surfaces and top surfaces of the first to third light-emitting devices 100_R, 100_G, and 100_B.

A black matrix 250 may be disposed on the protection layer 240. A plurality of pixel spaces PX2 may be defined by the black matrix 250 on the lower substrate 210. In detail, each of the plurality of pixel spaces PX2 may be divided from adjacent pixel spaces PX2 by the black matrix 250. Also, each of the pixel spaces PX2 may be divided into first to third sub-pixel spaces SP_R, SP_G, and SP_B by the black matrix 250. First to third light-emitting devices 100_R, 100_G, and 100_B may be disposed in the first to third sub-pixel spaces SP_R, SP_G, and SP_B, respectively.

FIG. 11 illustrates an example in which the first to third light-emitting devices 100_R, 100_G, and 100_B and the black matrix 250 are spaced apart from one another, but embodiments are not limited thereto. Unlike shown in FIG. 11, the black matrix 250 may be in contact with the entire side surface of each of the first to third light-emitting devices 100_R, 100_G, and 100_B. In this case, light emitted in a lateral direction from the inside of each of the first to third light-emitting devices 100_R, 100_G, and 100_B may be reflected by the black matrix 250 and emitted upward from the first to third light-emitting devices 100_R, 100_G, and 100_B.

FIG. 11 illustrates an example in which the side reflective layer (refer to 160S in FIG. 3) is not formed on a side surface of each of the first to third light-emitting devices 100_R, 100_G, and 100_B, but embodiments are not limited thereto. The side reflective layer 160S may be further formed on the side surface of each of the first to third light-emitting devices 100_R, 100_G, and 100_B.

Although not shown, an encapsulant may be further formed to surround each of the first to third light-emitting devices 100_R, 100_G, and 100_B in each of the first to third sub-pixel spaces SP_R, SP_G, and SP_B. However, embodiments are not limited thereto. In FIGS. 11 and 12, the illustration of an upper substrate, a storage capacitor (refer to Cst in FIG. 9), a gate line (refer to GL in FIG. 9), and a data line (refer to DL in FIG. 9) is omitted for brevity.

As shown in FIGS. 11 and 12, each of the plurality of pixel spaces PX2 may include the first to third light-emitting devices 100_R, 100_G, and 100_B. The first light-emitting device 100_R may emit red light, the second light-emitting device 100_G may emit green light, and the third light-emitting device 100_B may emit blue light. A data signal may be applied to the first to third light-emitting devices 100_R, 100_G, and 100_B, and light of three colors having a luminance corresponding to the data signal may be emitted by the first to third light-emitting devices 100_R, 100_G, and 100_B in response to the data signal. Accordingly, the display device 200A may have an increased luminance and display uniform images.

In addition, each of the first to third light-emitting devices 100_R, 100_G, and 100_B may have a planar area slightly less than each of planar areas of the first to third sub-pixel spaces SP_R, SP_G, and SP_B. For example, each of the first to third sub-pixel spaces SP_R, SP_G, and SP_B may have a first width WX2 of about 50 µm to about 300 µm in an X direction, and a second width WY2 of about 200 µm to about 600 µm in a Y direction. Also, each of the first to third light-emitting devices 100_R, 100_G, and 100_B may have a first width (refer to WX1 in FIG. 1) of about 10 µm to about 300 µm in the X direction and a second width (refer to XY1 in FIG. 1) of about 50 µm to about 500 µm in the Y direction. However, embodiments are not limited thereto.

In general, an amount of light required for one of a plurality of pixels of a display device may be obtained from an LED having a size of about 10 µm×10 µm. However, since the LED has a much smaller size than one pixel, when one pixel includes one LED, the LED may be a point light source. For example, a bright point having a high luminance may occur in a portion of the pixel disposed close to the LED. Thus, the pixel may have a non-uniform luminance, and light having a uniform light amount may not be provided to the entire pixel. When an additional optical system (e.g., a diffuser or a diffusing lens) is adhered between the LED and the pixel, light having a relatively uniform light amount may be provided to the pixel. However, the thickness and weight of the display device may increase by adhering the diffuser or the diffusing lens, so that it may be difficult to obtain a compact display device.

However, according to the present embodiment, the light-emitting structure 120 may be disposed on the first side surface of the substrate 110, and each of the first to third lights emitted by the light-emitting structure 120 may be uniformly emitted through the top surface of the substrate 110 upward from the display device 200. For example, each light-emitting structure 120 may be disposed on a respective substrate 110 within its corresponding sub-pixel space of the first to third sub-pixel spaces SP_R, SP_G, and SP_B. As described above, since an area of the top surface of the substrate 110 is slightly smaller than planar areas of the first to third sub-pixel spaces SP_R, SP_G, and SP_B, light may be uniformly emitted over substantially the entire areas of the first to third sub-pixel spaces SP_R, SP_G, and SP_B. That is, the light-emitting devices 100_R, 100_G, and 100_B may act as plane light sources using the top surface of the substrate 110 as a light extraction surface. Furthermore, it may be unnecessary to install an optical system, which is further needed when a micro-sized light-emitting device is used as a light source of a display device. Thus, the display device 200A may have a small thickness.

In addition, even if the light-emitting structure 120 has a small area (e.g., even if the light-emitting structure 120 has a width of several micrometers), a uniform amount of light may be provided over the entire top surfaces of the light-emitting devices 100_R, 100_G, and 100_B by increasing an area of the top surface of the substrate 110. Accordingly, the display device 200 including the light-emitting devices 100_R, 100_G, and 100_B may have increased flexibility in terms of design specifications (e.g., luminance, power consumption, and pixel size) of the display device 200.

Figure 13:
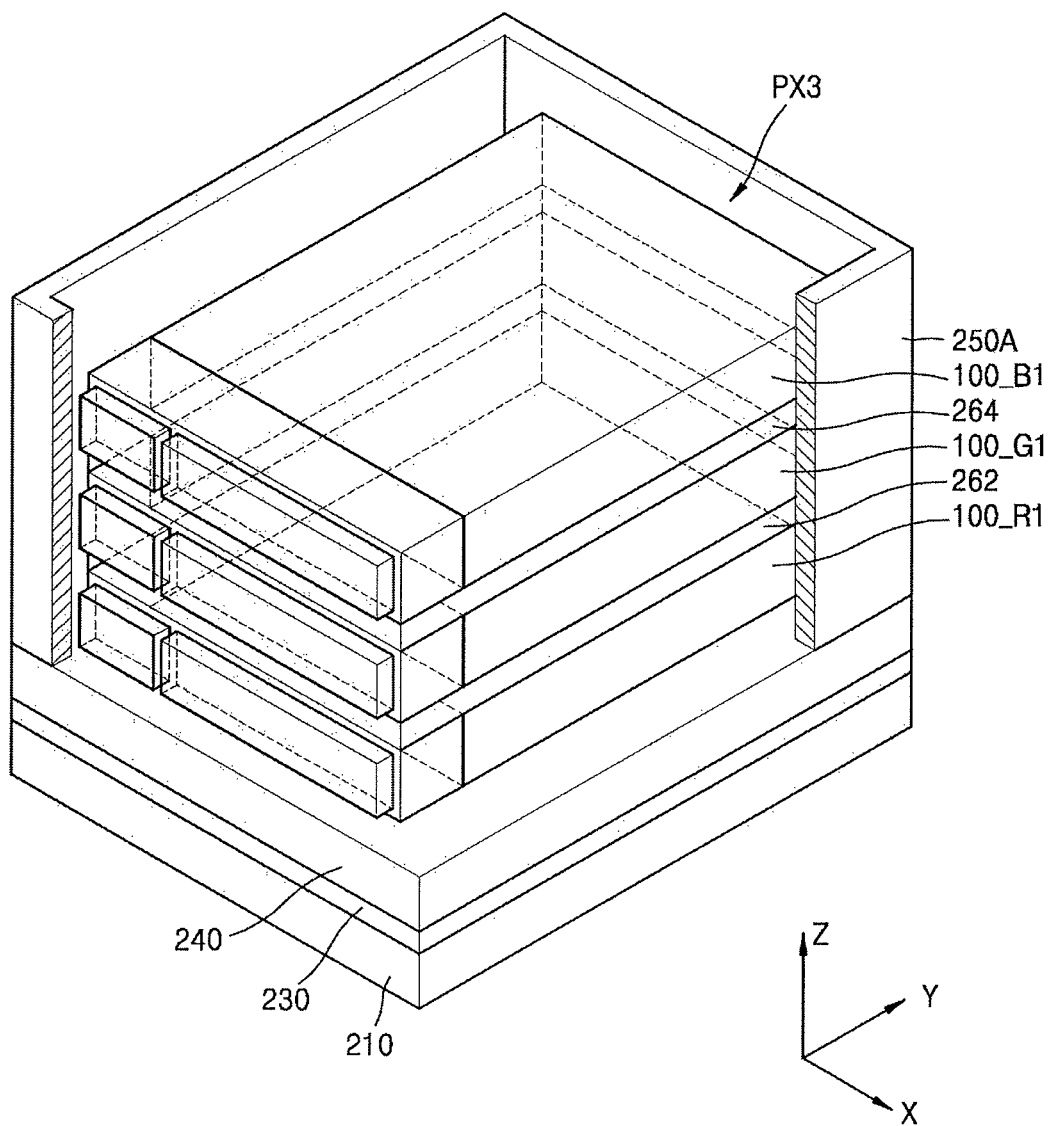
FIG. 13 illustrates a cross-sectional view of a display device according to an embodiment.

FIG. 13 is a cross-sectional view of a display device 200B according to an embodiment. In FIG. 13, the same reference numerals are used to denote the same elements as in FIGS. 1 to 12.

Referring to FIG. 13, a plurality of pixel spaces PX3 may be provided on a lower substrate 210. First to third light-emitting devices 100_R1, 100_G1, and 100_B1 may be stacked in each of the plurality of pixel spaces PX3 in a vertical direction (Z direction in FIG. 13).

The first to third light-emitting devices 100_R1, 100_G1, and 100_B1 may have similar technical features as the light-emitting devices 100, 100A, 100B, and 100C described with reference to FIGS. 1 to 6.

A first middle layer 262 may be disposed between the first light-emitting device 100_R1 and the second light-emitting device 100_G1, and a second middle layer 264 may be disposed between the second light-emitting device 100_G1 and the third light-emitting device 100_B1. The first and second middle layers 262 and 264 may include an insulating material having light transmittance. In embodiments, each of the first and second middle layers 262 and 264 may be formed by depositing an insulating material, e.g., $SiO_2$, $SiO_xN_y$, or $Si_xN_y$.

The black matrix 250A may isolate each of the plurality of pixel spaces PX3 from adjacent pixel spaces PX3. Unlike in the display device 200 of FIG. 11, each of the plurality of pixel spaces PX3 may not be separated into a plurality of sub-pixel spaces. The black matrix 250A may surround sidewalls of first to third light-emitting devices 100_R1, 100_G1, and 100_B1.

Although not shown in FIG. 13, three drivers TFT (refer to FIG. 12) may be formed on the lower substrate 210 and electrically connected to the first to third light-emitting devices 100_R1, 100_G1, and 100_B1, respectively.

As shown in FIG. 13, a first light-emitting device 100_R1 configured to emit red light may be disposed on a protection layer 240, a second light-emitting device 100_G1 configured to emit green light may be disposed on the first light-emitting device 100_R1, and a third light-emitting device 100_B1 configured to emit blue light may be disposed on the second light-emitting device 100_G1. However, embodiments are not limited thereto, and relative locations and/or sizes of the first to third light-emitting devices 100_R1, 100_G1, and 100_B1 may be changed.

In the display device 200B, each of the plurality of pixel spaces PX3 may include first to third light-emitting devices 100_R1, 100_G1, and 100_B1, which are stacked in a vertical direction. Thus, light of three colors may be uniformly emitted by the plurality of pixel spaces PX3 over substantially the entire areas of the pixel spaces PX3. Accordingly, the display device 200 may have improved luminance and display uniform images.

Figure 14:
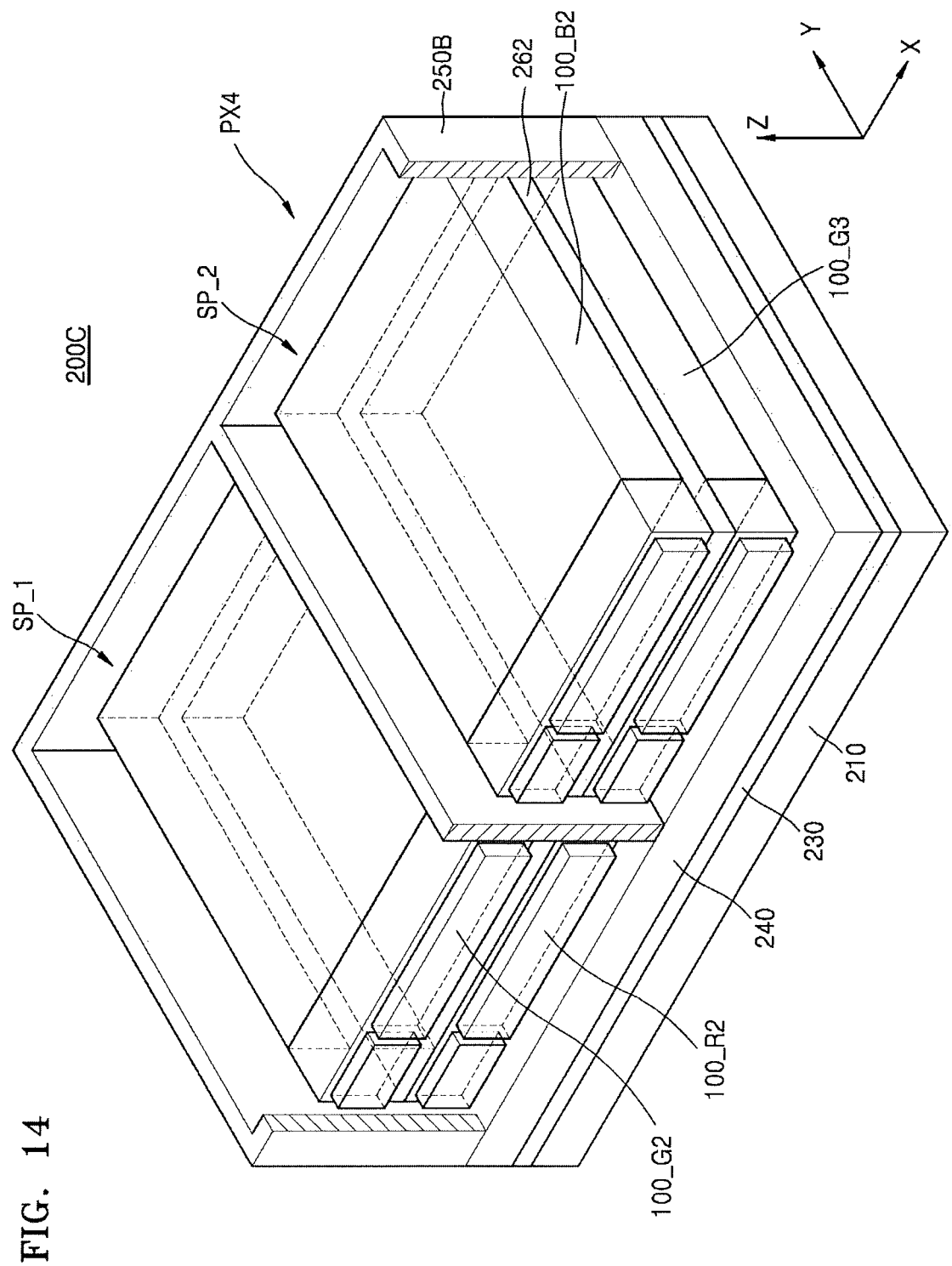
FIG. 14 illustrates a cross-sectional view of a display device according to an embodiment.

FIG. 14 is a cross-sectional view of a display device 200C according to an embodiment. In FIG. 14, the same reference numerals are used to denote the same elements as in FIGS. 1 to 13.

Referring to FIG. 14, a plurality of pixel spaces PX4 may be provided on a lower substrate 210. Each of the plurality of pixel spaces PX4 may be separated into first and second sub-pixel spaces SP_1 and SP_2 by a black matrix 250B.

First and second light-emitting devices 100_R2 and 100_G2 may be stacked in the first sub-pixel space SP_1 in a vertical direction (Z direction in FIG. 14). Third and fourth light-emitting devices 100_G3 and 100_B2 may be stacked in the second sub-pixel space SP_2 in a vertical direction.

The first light-emitting device 100_R2 may emit red light, the second and third light-emitting devices 100_G2 and 100_G3 may emit green light, and the fourth light-emitting device 100_B2 may emit blue light. However, embodiments are not limited thereto.

The first to fourth light-emitting devices 100_R2, 100_G2, 100_G3, and 100_B2 may have similar technical features to the light-emitting devices 100, 100A, 100B, and 100C described with reference to FIGS. 1 to 6.

FIGS. 15 to 20 are cross-sectional views of a method of manufacturing a light-emitting device according to an embodiment. FIGS. 15 to 20 are cross-sectional views taken along a line II-II' of FIG. 1, which illustrate process operations of the method of manufacturing the light-emitting device. In FIGS. 15 to 20, the same reference numerals are used to denote the same elements as in FIGS. 1 to 14.

Figure 15:
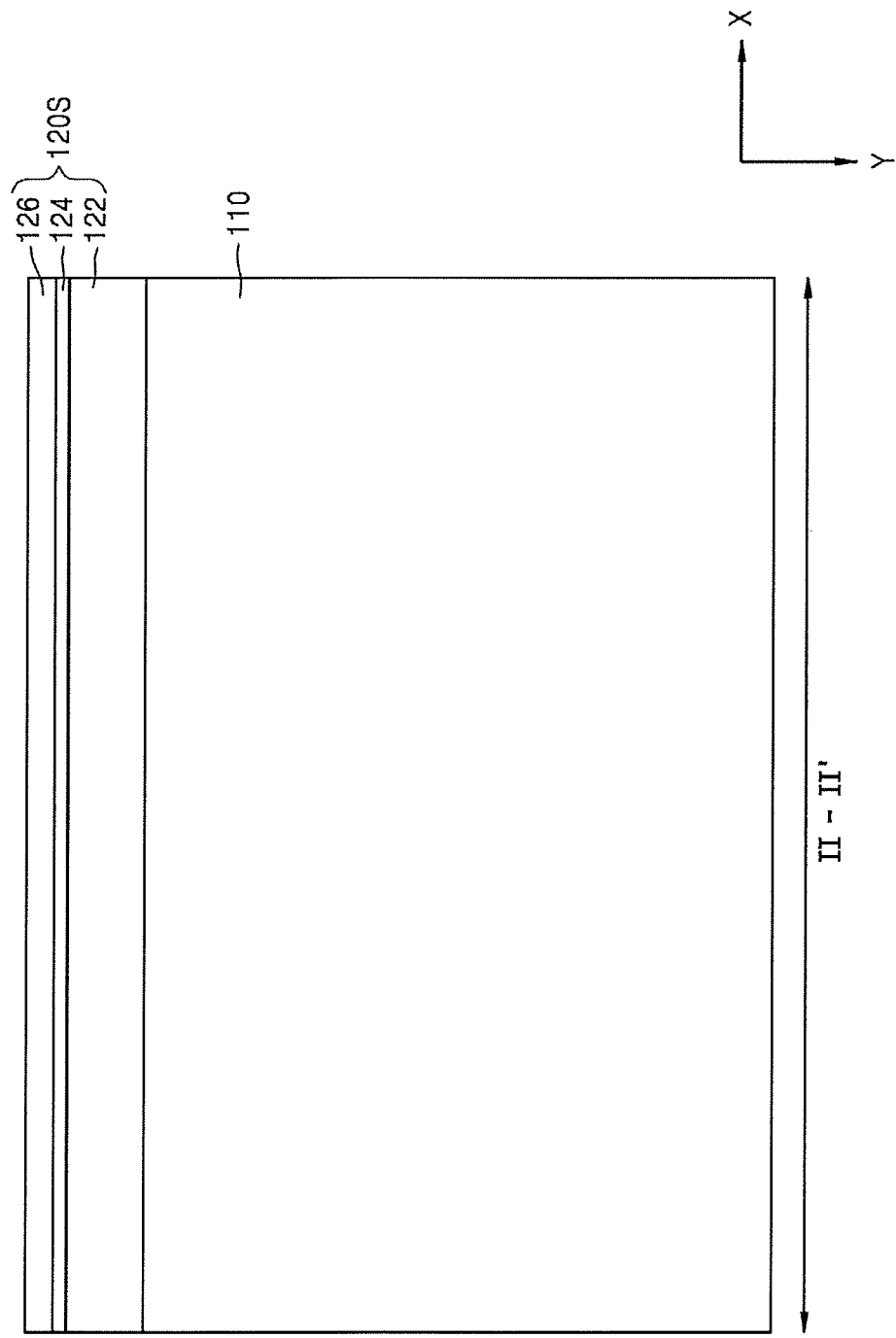
FIGS. 15 to 20 illustrate cross-sectional views of stages in a method of manufacturing a light-emitting device according to an embodiment.

Referring to FIG. 15, a semiconductor layer stack 120S including the first-conductivity-type semiconductor layer 122, the active layer 124, and the second-conductivity-type semiconductor layer 126 may be formed on the substrate 110. In embodiments, the substrate 110 may be an insulating substrate, e.g., a sapphire substrate.

Figure 16:
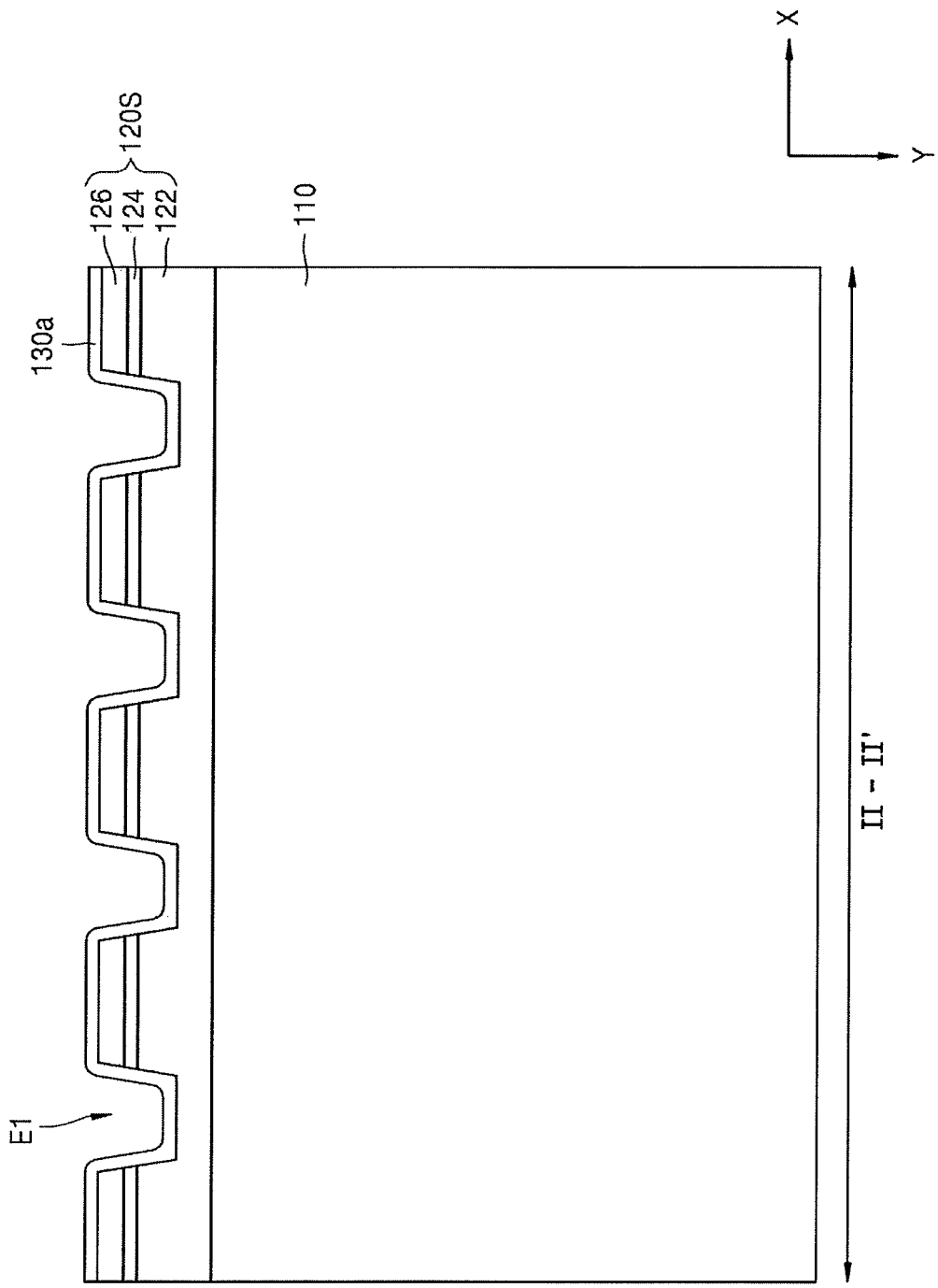

Referring to FIG. 16, a mesa etching process may be performed on the semiconductor layer stack 120S to expose a portion E1 of the first-conductivity-type semiconductor layer 122, and a first insulating layer 130a may be deposited. Due to the mesa etching process, at least one mesa may be formed in each light-emitting device.

Figure 17:
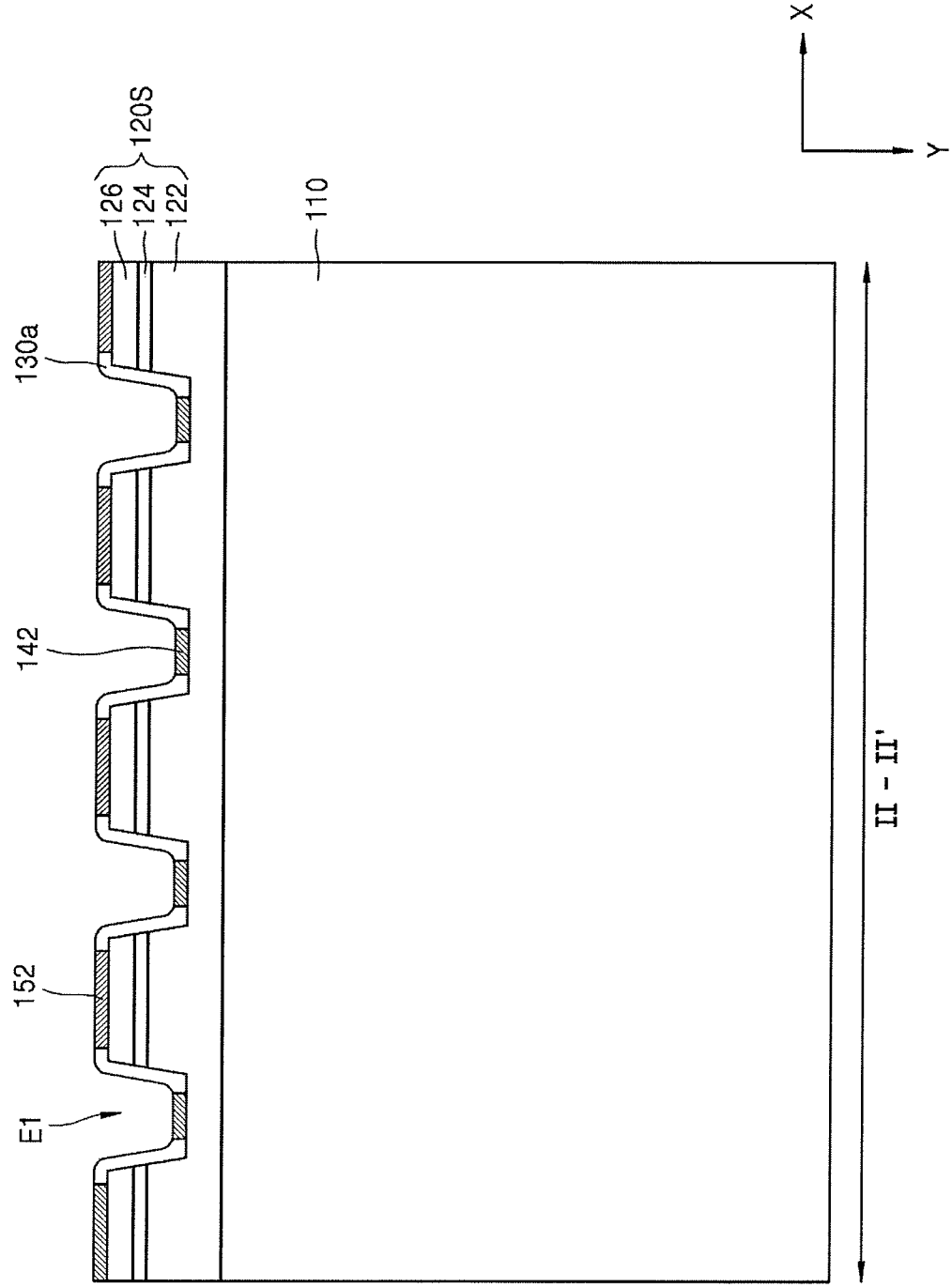

Referring to FIG. 17, a portion of the first insulating layer 130a may be etched, and a conductive ohmic material may be deposited to form first and second electrode units 142 and 152. The first and second electrode units 142 and 152 may be reflective electrodes including at least one of, e.g., silver (Ag), aluminum (Al), nickel (Ni), chromium (Cr), copper (Cu), gold (Au), palladium (Pd), platinum (Pt), tin (Sn), tungsten (W), rhodium (Rh), iridium (Ir), ruthenium (Ru), magnesium (Mg), zinc (Zn), and an alloy thereof.

Figure 18:
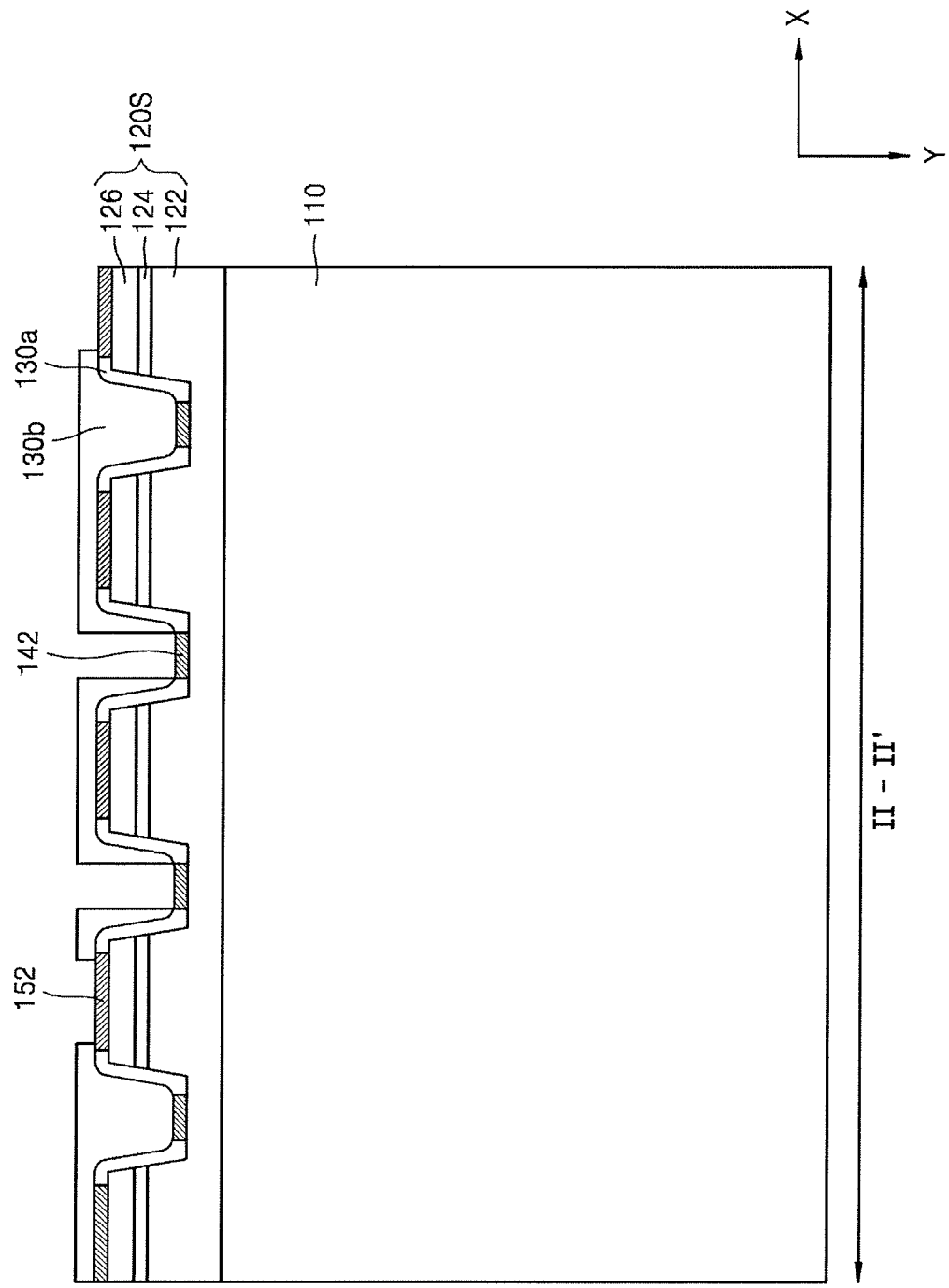

Referring to FIG. 18, a second insulating layer 130b may be formed on the first insulating layer 130a and the first and second electrode units 142 and 152. Portions of the first and second electrode units 142 and 152 may be exposed by using an etching process.

Figure 19:
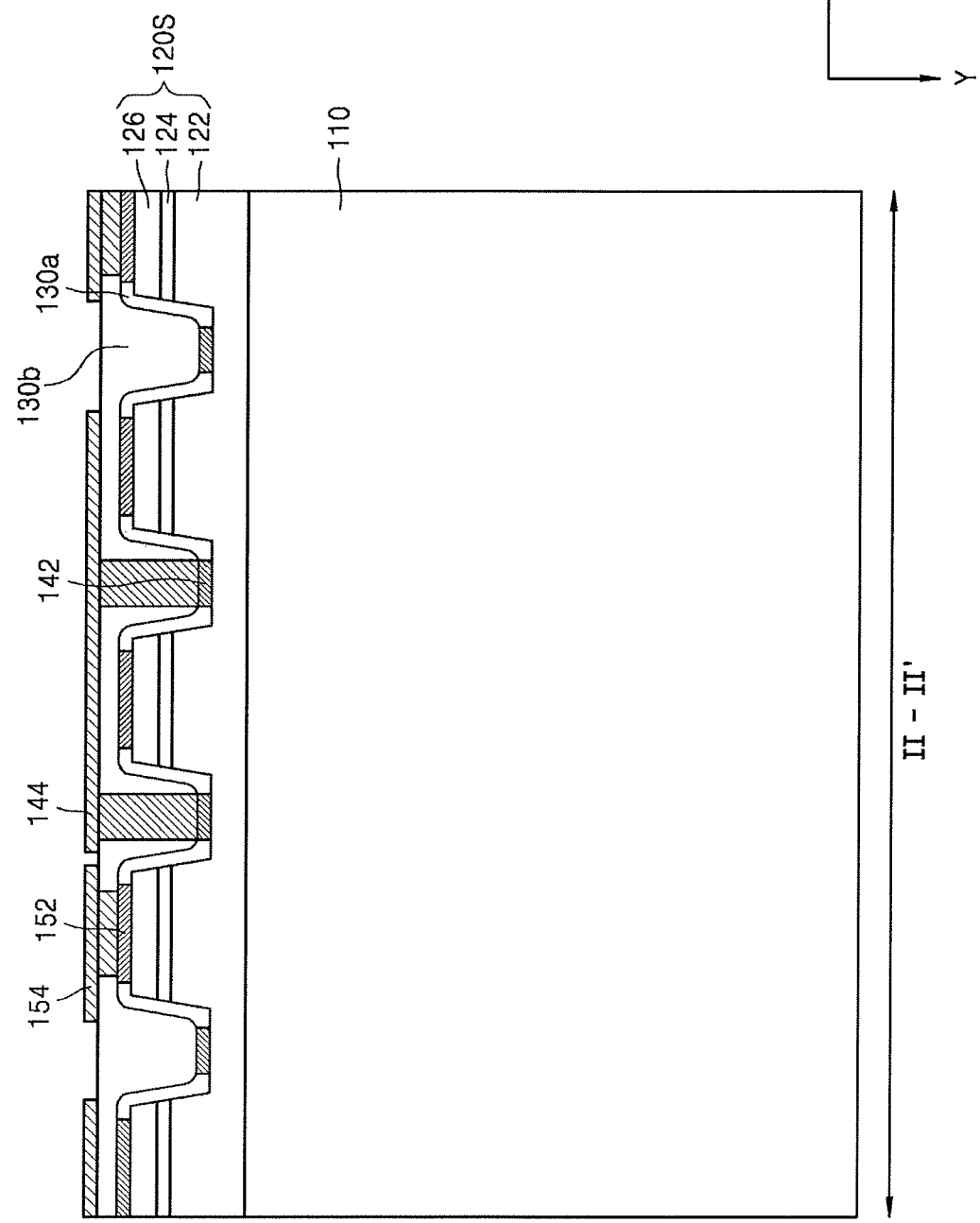

Referring to FIG. 19, first and second pads 144 and 154 may be formed on the first and second electrode units 142 and 152. The first and second pads 144 and 154 may be electrically connected to the first and second electrode units 142 and 152, respectively.

Figure 20:
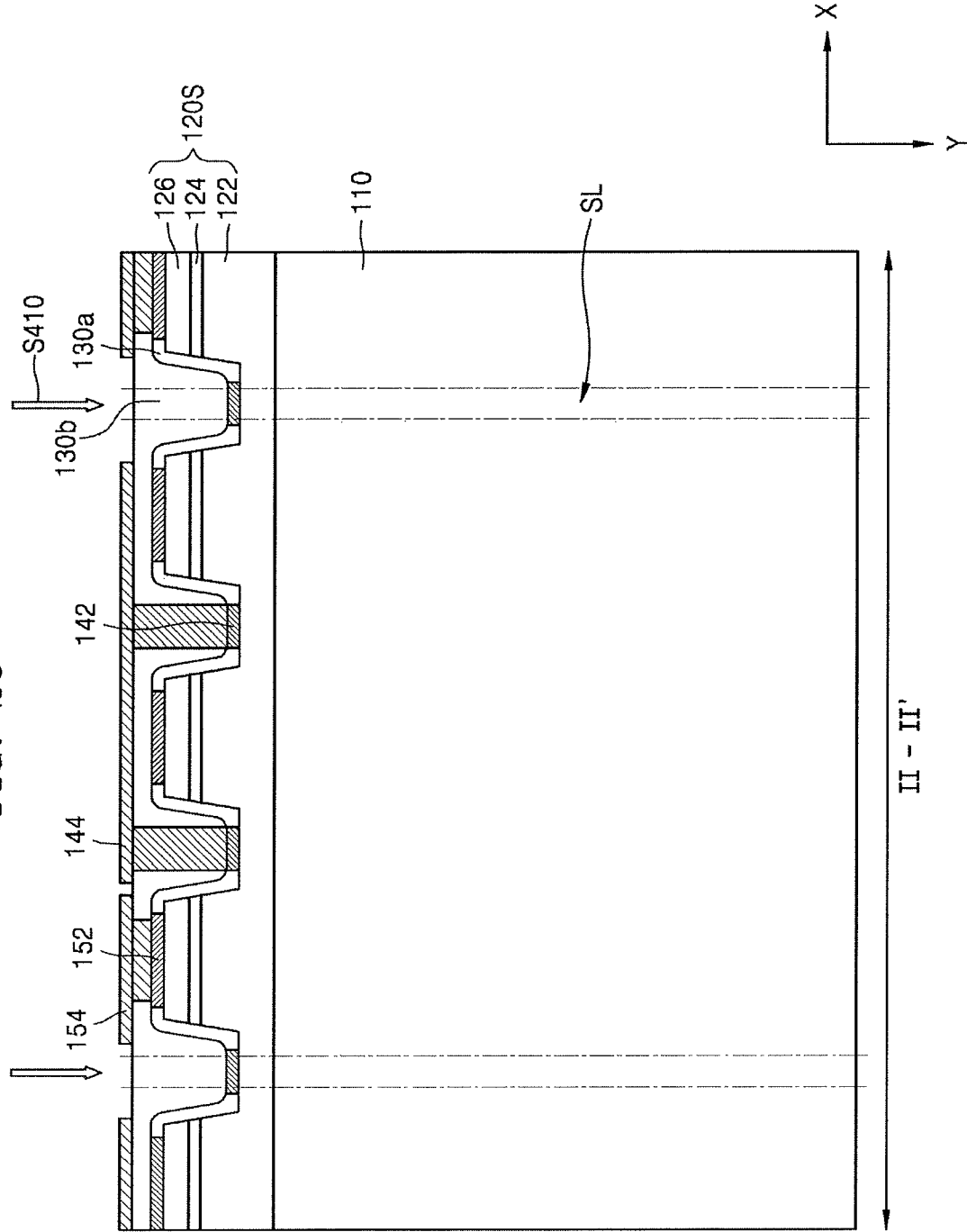

Referring to FIG. 20, an isolation process (S410) of separating individual chips from one another may be performed. The isolation process S410 may be performed by using a blade, but embodiments are not limited thereto. The substrate 110 may be cut along with the semiconductor layer stack 120S along a scribe lane SL.

Although not shown, before the isolation process S410, a grinding process of removing a bottom surface of the substrate 110 to a predetermined thickness may be further performed. In this case, the substrate 110 may be cut off from the exposed bottom surface of the substrate 110 by using the grinding process, but embodiments are not limited thereto.

FIGS. 15 to 20 illustrate an example of a method of forming the semiconductor layer stack 120S on the insulating substrate (e.g., a sapphire substrate). However, in another case, the semiconductor layer stack 120S may be formed on a growth substrate, such as a silicon substrate. In this case, before or after the isolation process S410, a process of removing the growth substrate and a process of adhering the semiconductor layer stack 120S to a top surface of a transparent substrate (e.g., a glass substrate) may be further performed. In the process of removing the growth substrate, an uneven portion (refer to P in FIG. 6) may be formed on a top surface of the semiconductor layer stack 120S.

After the process of removing the growth substrate, the optical wavelength conversion layer 170 may be formed on the top surface of the semiconductor layer stack 120S, and a transparent substrate may be adhered to a top surface of the optical wavelength conversion layer 170. As a result, the light-emitting device 100C described with reference to FIG. 6 may be manufactured.

In addition, a process of forming a reflective layer on a side surface or a bottom surface of a light-emitting device that is separated into individual chips by the isolation process S410. For example, the formation of the bottom reflective layer (refer to 160B in FIG. 5) may include forming a mask on the bottom surface of the light-emitting device and forming the bottom reflective layer 160B on a portion of the bottom surface of the light-emitting device, which is not covered with the mask, by using a spray process, a sputtering process, or an electron beam (e-beam) evaporation process. For example, the formation of the side reflective layer (refer to 160S in FIG. 3) may include forming a mask on a top surface of the light-emitting device and forming the side reflective layer 160S on the side surface of the light-emitting device by using a spray process. However, processes of forming the reflective layer are not limited to those described above.

Thus far, the light-emitting devices 100, 100A, 100B, and 100C and the display devices 200, 200A, 200B, and 200C including the light-emitting devices 100, 100A, 100B, and 100C have been described in detail. As described above with reference to FIGS. 7 to 14, the light-emitting devices 100, 100A, 100B, and 100C according to the embodiments may be included not only in panels of the display devices 200, 200A, 200B, and 200C but also in BLUs of the display devices 200, 200A, 200B, and 200C or used as lighting devices.

Hereinafter, BLUs including the light-emitting devices 100, 100A, 100B, and 100C according to the embodiments and display devices using the BLUs will be described.

Figure 22:
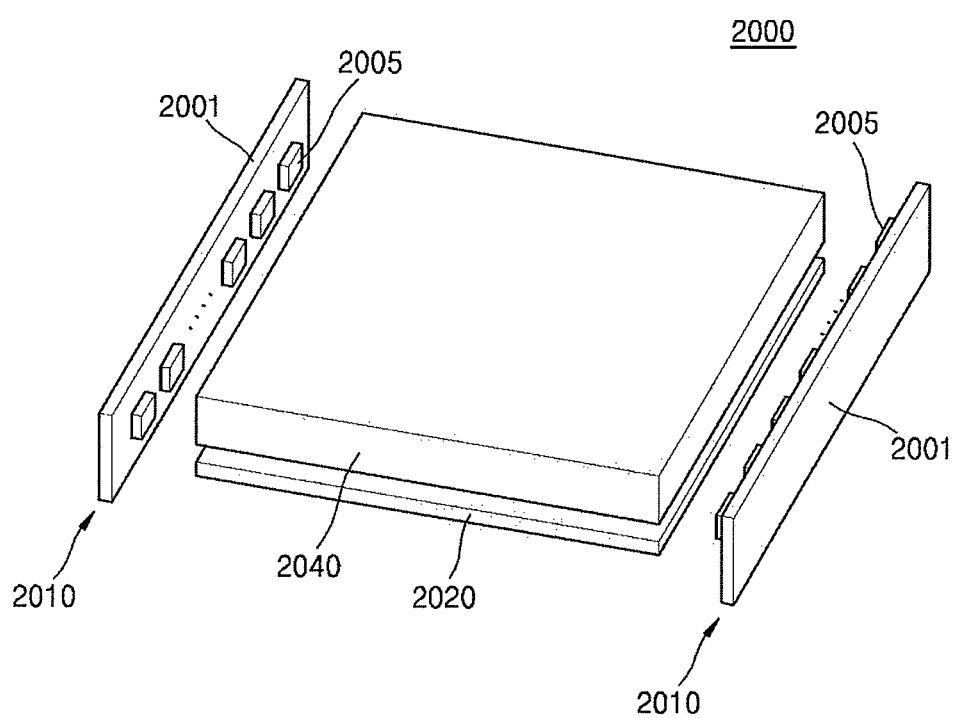
FIG. 22 illustrates a perspective view of a backlight unit (BLU) adopting a light-emitting device according to an embodiment.

FIG. 22 is a perspective view of a BLU 2000 adopting a light-emitting device according to an embodiment.

Referring to FIG. 22, the BLU 2000 may include a light guide plate (LGP) 2040 and light source modules 2010 provided on both, e.g., opposite, side surfaces of the LGP 2040. Also, the BLU 2000 may further include a reflection plate 2020 disposed under the LGP 2040, e.g., on a surface opposite to a surface emitting light. The BLU 2000 according to the present embodiment may be an edge-type BLU.

For example, the light source module 2010 may be provided on only one side surface of the LGP 2040. In another example, an additional light source module 2010 may be further provided on another side surface of the LGP 2040. The light source module 2010 may include a printed circuit board (PCB) 2001 and a plurality of light sources 2005 mounted on a top surface of the PCB 2001.

Figure 23:
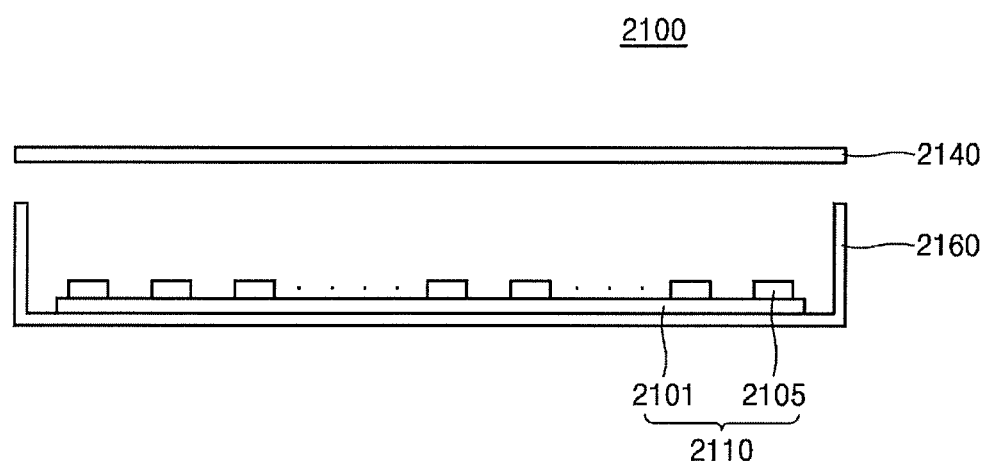
FIG. 23 illustrates a cross-sectional view of a BLU adopting a light-emitting device according to an embodiment.

FIG. 23 is a cross-sectional view of a BLU 2100 adopting a light-emitting device according to an embodiment.

Referring to FIG. 23, the BLU 2100 may include a light diffusing plate 2140 and a light source module 2110 arranged under the light diffusing plate 2140. Also, the BLU 2100 may be disposed under the light diffusing plate 2140 and further include a bottom case 2160 capable of containing the light source module 2110. The BLU 2100 according to the present embodiment may be a direct-light-type BLU. The light source module 2110 may include the PCB 2101 and the plurality of light sources 2105 mounted on a top surface of the PCB 2101.

Figure 24:
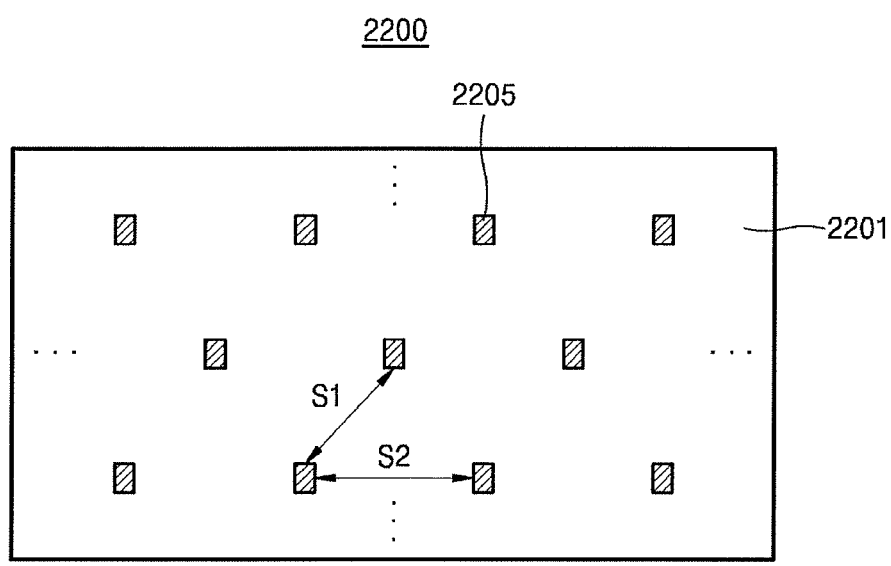
FIG. 24 illustrates an example of arrangement of a light source in a direct-light-type BLU.

FIG. 24 illustrates an example of arrangement of light sources in a direct-light-type BLU.

The direct-light-type BLU 2200 according to the present embodiment may include a plurality of light sources 2205 arranged on a substrate 2201.

The light sources 2205 may be arranged as a matrix type in rows and columns, and each of the rows and columns may have a zigzag shape. In other words, a second matrix having the same shape as a first matrix may be arranged in the first matrix in which the plurality of light sources 2205 are arranged in rows and columns, and each of light sources 2205 of the second matrix may be disposed in a quadrangle formed by four adjacent light sources 2205 included in the second matrix.

However, to further improve luminous uniformity and optical efficiency of the direct-light-type BLU 2200, an arrangement and interval of the first matrix may be different from those of the second matrix as when necessary. Also, in addition to the above-described method of arranging the plurality of light sources, distances S1 and S2 between adjacent light sources may be optimized to ensure luminous uniformity. When rows and columns of the light sources 2205 are arranged not in straight lines but in zigzag as described above, the number of light sources 2205 per emission area may be reduced by about 15% to about 25%.

Figure 25:
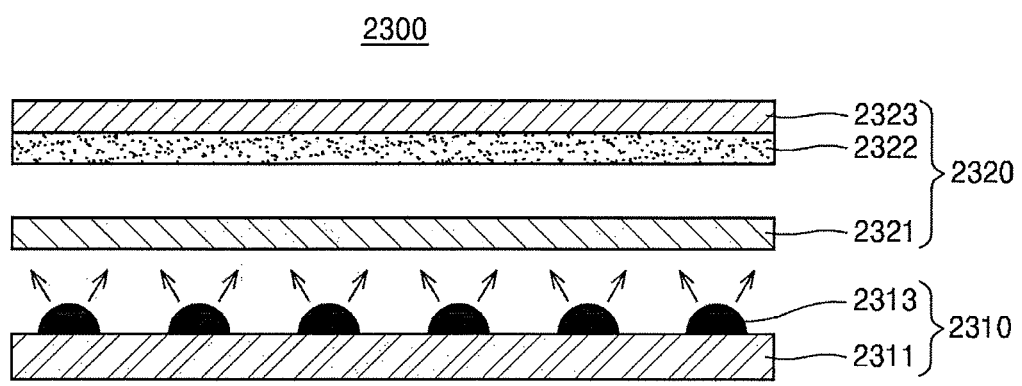
FIG. 25 illustrates a cross-sectional view of a BLU adopting a light-emitting device according to an embodiment.

FIG. 25 is a cross-sectional view of a BLU 2300 adopting a light-emitting device according to an embodiment.

Referring to FIG. 25, the BLU 2300 may include an optical sheet 2320 and a light source module 2310 arranged under the optical sheet 2320.

The optical sheet 2320 may include a diffusing sheet 2321, a condensing sheet 2322, and a protection sheet 2323.

The light source module 2310 may include a circuit substrate 2311, a plurality of light sources mounted on the circuit substrate 2311, and a plurality of optical devices 2313 disposed on the plurality of light sources, respectively. The optical devices 2313 may refract light and control an orientation angle of the light. In particular, a wide orientation angle lens configured to diffuse light emitted by the light source to a wide area may be mainly used as the optical device 2313. Since the light source to which the optical device 2313 is adhered has a relatively wide light distribution, when the light source module 2310 is used for a backlight or a flat-panel lighting device, the number of required light sources per area may be reduced.

Hereinafter, a lighting apparatus including at least one of the light-emitting devices 100, 100A, 100B, and 100C according to the embodiments will be described.

Figure 26:
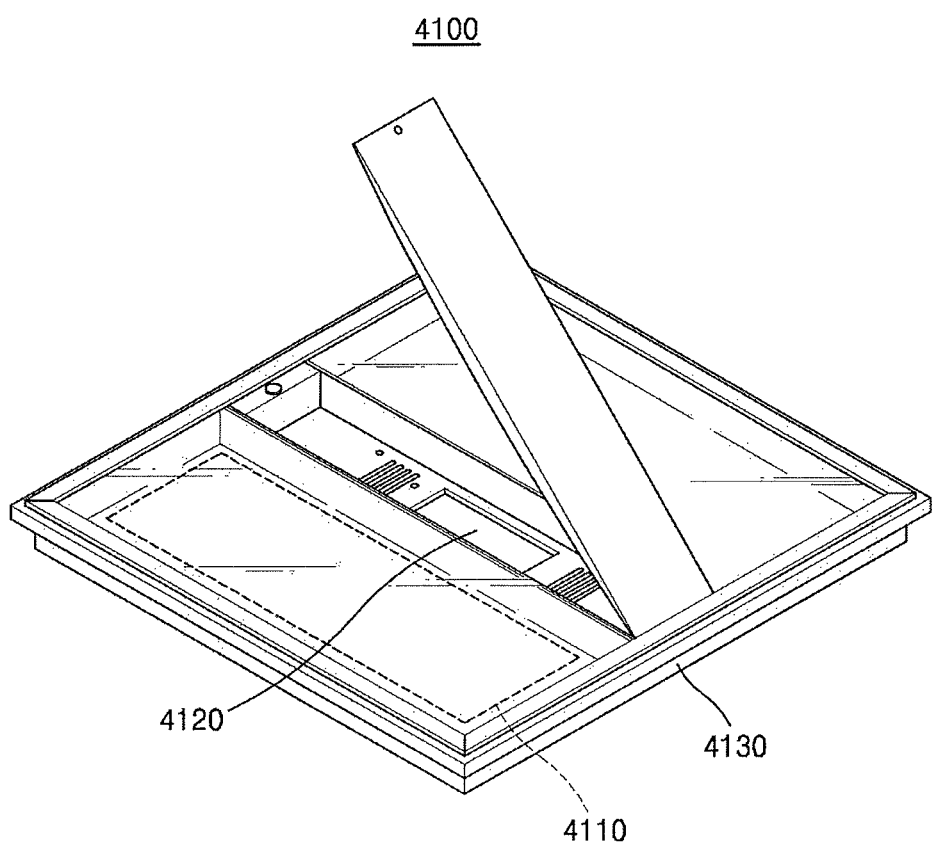
FIG. 26 illustrates a perspective view of a flat-panel lighting apparatus according to an embodiment.

FIG. 26 is a perspective view of a flat-panel lighting apparatus 4100 according to an embodiment.

Referring to FIG. 26, the flat-panel lighting apparatus 4100 may include a light source module 4110, a power supply device 4120, and a housing 4030. In an embodiment, the light source module 4110 may include a light-emitting device array as a light source, and the power supply device 4120 may include a light-emitting device driver. The light source module 4010 may include at least one of the light-emitting device 100, 100A, 100B, and 100C according to the embodiments.

The light source module 4110 may include the light-emitting device array and have a generally planar shape. In an embodiment, the light-emitting device array may include a light-emitting device and a controller configured to store driving information of the light-emitting device.

The power supply device 4120 may be configured to supply power to the light source module 4110. The housing 4130 may provide a containing space in which the light source module 4110 and the power supply device 4120 are contained, and one side surface of the housing 4130 may have an open hexahedral shape, but embodiments are not limited thereto. The light source module 4110 may be disposed to emit light toward the open side surface of the housing 4130.

However, embodiments are not limited thereto, and the light-emitting devices 100, 100A, 100B, and 100C according to the embodiments may be applied not only to flat-panel lighting apparatuses but also to bar-type lamps or bulb-type lamps.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting device, comprising:
  a substrate including a top surface and a first side surface, wherein an area of the top surface is larger than an area of the first side surface;
  a light-emitting structure on the first side surface of the substrate, the light-emitting structure including:
    a first-conductivity-type semiconductor layer,
    a second-conductivity-type semiconductor layer, and
    an active layer between the first-conductivity-type semiconductor layer and the second-conductivity-type semiconductor layer,
    wherein the substrate has a first width in a direction perpendicular to the first side surface of the substrate and a first height in a direction perpendicular to the top surface of the substrate, the first width being at least two times longer than the first height,
    wherein the light-emitting structure emits a first light having a first peak wavelength, and
    wherein an emission area of a first light emitted through the top surface of the substrate is larger than an emission area of a first light emitted through the first side surface of the substrate;
  a first electrode on the first side surface of the substrate and electrically connected to the first-conductivity-type semiconductor layer, the first-conductivity-type semiconductor layer being between the first electrode and the first side surface of the substrate; and
  a second electrode on the first side surface of the substrate and electrically connected to the second-conductivity-type semiconductor layer, the second-conductivity-type semiconductor layer being between the second electrode and the first side surface of the substrate,
  wherein at least a portion of each of the first and second electrodes overlaps each of the first-conductivity-type semiconductor layer, the second-conductivity-type semiconductor layer, and the active layer along a direction normal to the first side surface of the substrate.

2. The light-emitting device as claimed in claim 1, wherein the substrate is a crystal growth substrate of the light-emitting structure.

3. The light-emitting device as claimed in claim 1, wherein:
  the light-emitting structure overlaps the entire first side surface of the substrate, such that at least the first-conductivity-type semiconductor layer faces and overlaps the entire first side surface of the substrate, and
  an area of the top surface of the substrate is larger than an overlap area between the light-emitting structure and the first side surface of the substrate.

4. The light-emitting device as claimed in claim 3, wherein a ratio of an area of the top surface of the substrate to the overlap area ranges from about 2:1 to about 100:1.

5. The light-emitting device as claimed in claim 1, wherein a ratio of the first width to the first height is about 2:1 to about 100:1.

6. The light-emitting device as claimed in claim 1, wherein:
  the substrate further comprises a second side surface other than the first side surface, and
  the light-emitting device further comprises a side reflective layer on the second side surface of the substrate to reflect first light emitted by the light-emitting structure toward the second side surface of the substrate.

7. The light-emitting device as claimed in claim 6, wherein the side reflective layer covers a portion of a side surface of the light-emitting structure.

8. The light-emitting device as claimed in claim 1, further comprising a bottom reflective layer on a bottom surface of the substrate to reflect first light emitted by the light-emitting structure toward the bottom surface of the substrate.

9. The light-emitting device as claimed in claim 1, further comprising:
  a first bottom reflective layer on a bottom surface of the substrate and electrically connected to the first electrode, the first bottom reflective layer reflecting first light emitted by the light-emitting structure toward the bottom surface of the substrate; and
  a second bottom reflective layer on the bottom surface of the substrate and electrically connected to the second electrode, the second bottom reflective layer reflecting first light emitted by the light-emitting structure toward the bottom surface of the substrate.

* * * * *